US012665782B2

(12) United States Patent
Rennig et al.

(10) Patent No.: US 12,665,782 B2
(45) Date of Patent: Jun. 23, 2026

(54) PROCESSING SYSTEM, RELATED INTEGRATED CIRCUIT, DEVICE AND METHOD

(71) Applicants: STMicroelectronics Application GMBH, Aschheim-Dornach (DE); STMICROELECTRONICS DESIGN AND APPLICATION S.R.O., Prague (CZ); STMicroelectronics S.r.l., Agrate Brianza (IT)

(72) Inventors: Fred Rennig, Nandlstadt (DE); Jochen Barthel, Schechen (DE); Ludek Beran, Strancice (CZ); Mirko Dondini, Catania (IT); Vaclav Dvorak, Mratín (CZ); Vincenzo Polisi, Sta Maria di Licodia (IT); Marianna Sanza', Trecastagni (IT); Calogeroandrea Trecarichi, Gela (IT); Alfonso Furio, Munich (DE)

(73) Assignees: STMicroelectronics S.r.l., Agrate Brianza (IT); STMicroelectronics Application GMBH, Aschheim-Dornach (DE); STMICROELECTRONICS DESIGN AND APPLICATION S.R.O., Prague (CZ)

( * ) Notice: Subject to any disclaimer, the term of this patent is extended or adjusted under 35 U.S.C. 154(b) by 419 days.

(21) Appl. No.: 18/174,387

(22) Filed: Feb. 24, 2023

(65) Prior Publication Data

US 2023/0300001 A1 Sep. 21, 2023

(30) Foreign Application Priority Data

Mar. 18, 2022 (IT) ........................ 102022000005354

(51) Int. Cl.
| | |
|---|---|
| *H04L 12/40* | (2006.01) |
| *H03K 17/687* | (2006.01) |
| *H03K 19/00* | (2006.01) |

(52) U.S. Cl.
CPC ... *H04L 12/40169* (2013.01); *H03K 17/6872* (2013.01); *H03K 17/6874* (2013.01);
(Continued)

(58) Field of Classification Search
CPC ......... H04L 12/40032; H04L 12/40169; H04L 2012/40215; H04L 2012/40273;
(Continued)

(56) References Cited

U.S. PATENT DOCUMENTS

| | | | |
|---|---|---|---|
| 11,444,802 B2 | 9/2022 | Repp | |
| 2010/0033210 A1 | 2/2010 | Baek | |

(Continued)

FOREIGN PATENT DOCUMENTS

| | | |
|---|---|---|
| CN | 102324924 A | 1/2012 |
| CN | 112859663 A | 5/2021 |
| WO | 2015011515 A1 | 1/2015 |

OTHER PUBLICATIONS

CiA, "CAN FD Light Specification and test plan", CAN in Automation (CiA) 604-1, version 1.0.0, or "CAN FD Light Network Protocol and Implementation," EuES003-06, version 1.3, Mar. 8, 2022, 16 pages.

(Continued)

*Primary Examiner* — Chun Kuan Lee
(74) *Attorney, Agent, or Firm* — Slater Matsil, LLP

(57) ABSTRACT

In an embodiment a processing system includes a sub-circuit including a three-state driver circuit, wherein the three-state driver circuit has a combinational logic circuit configured to monitor logic levels of a first signal and a second signal, and selectively activate one of the following switching states as (Continued)

a function of the logic levels of the first signal and the second signal: in a first switching state, connect the transmission terminal to the positive supply terminal by closing the first electronic switch, in a second switching state, connect the transmission terminal to the negative supply terminal by closing the second electronic switch, and in a third switching state, put the transmission terminal in a high-impedance state by opening the first electronic switch and the second electronic switch.

20 Claims, 8 Drawing Sheets

(52) U.S. Cl.
CPC ... *H03K 19/0002* (2013.01); *H04L 12/40032* (2013.01); *H04L 2012/40215* (2013.01); *H04L 2012/40273* (2013.01)

(58) Field of Classification Search
CPC ........... H03K 17/6874; H03K 17/6872; H03K 19/0002; G06F 3/4068; G06F 13/4295

USPC ........................................................ 710/110
See application file for complete search history.

(56) References Cited

U.S. PATENT DOCUMENTS

| | | | |
|---|---|---|---|
| 2014/0365693 A1* | 12/2014 | Monroe | G06F 3/00 |
| | | | 710/105 |
| 2016/0234038 A1* | 8/2016 | Mounier | G06F 13/4022 |
| 2018/0189129 A1* | 7/2018 | Jansen | G06F 11/0796 |
| 2021/0120017 A1* | 4/2021 | Antonsson | G01R 27/16 |
| 2021/0357344 A1 | 11/2021 | Rennig et al. | |
| 2022/0191059 A1 | 6/2022 | Rennig et al. | |

OTHER PUBLICATIONS

Kvaser, "CAN FD Light for rubust, reliable lightening applications," https ://www. kvaser.com/can-fd-light-for-robust-reliable-lighting-applications, Sep. 24, 2020, 4 pages.
STMicroelectronics, "32-channel LED driver with automotive CAN FD Light interface," Datasheet—production data, Dec. 1, 2021 1 page.

* cited by examiner

PROCESSING SYSTEM, RELATED INTEGRATED CIRCUIT, DEVICE AND METHOD

CROSS-REFERENCE TO RELATED APPLICATIONS

This application claims the benefit of Italian Application No. 102022000005354, filed on Mar. 18, 2022, which application is hereby incorporated herein by reference.

TECHNICAL FIELD

Embodiments of the present disclosure relate to a processing system, such as a microcontroller, configured to exchange data via a CAN FD Light bus.

BACKGROUND

FIG. 1 shows a typical electronic system, such as the electronic system of a vehicle, comprising a plurality of processing systems 10, such as embedded systems or integrated circuits, e.g., a Field Programmable Gate Array (FPGA), a Digital Signal Processor (DSP) or a micro-controller (e.g., dedicated to the automotive market).

For example, in FIG. 1 are shown three processing systems $10_1$, $10_2$ and $10_3$ connected through a suitable communication system 20. For example, the communication system may include a vehicle control bus, such as a Controller Area Network (CAN) bus, and possibly a multimedia bus, such as a Media Oriented Systems Transport (MOST) bus, connected to vehicle control bus via a gateway. Typically, the processing systems 10 are located at different positions of the vehicle and may include, e.g., an Engine Control Unit, a Transmission Control Unit (TCU), an Anti-lock Braking System (ABS), a Body Control Module (BCM), and/or a navigation and/or multimedia audio system. Accordingly, one or more of the processing systems 10 may also implement real-time control and regulation functions. These processing systems are usually identified as Electronic Control Units (ECU).

FIG. 2 shows a block diagram of an exemplary digital processing system 10, such as a microcontroller, which may be used as any of the processing systems 10 of FIG. 1.

In the example considered, the processing system 10 comprises a digital processing circuit 102. For example, the digital processing circuit 102 may comprise one or more dedicated combinational and/or sequential logic circuits and/or microprocessors programmed via software instructions and/or programmable logic circuits, such as an FPGA. Usually, the software executed by the microprocessor 102 and/or the program data of the programmable logic circuit are stored in a non-volatile program memory 104, such as a Flash memory or EEPROM. Thus, the memory 104 is configured to store the firmware of the processing unit 102, wherein the firmware includes the software instructions to be executed by the microprocessor 102 and/or the program data of a programmable logic circuit. Generally, the non-volatile memory 104 may also be used to store other data, such as configuration data, e.g., calibration data.

The digital processing circuit 102 usually has associated also a volatile memory 104b, such as a Random-Access-Memory (RAM). For example, the memory 104b may be used to store temporary data.

As shown in FIG. 2, usually the communication with the memories 104 and/or 104b is performed via one or more memory controllers 100. The memory controller(s) 100 may be integrated in the digital processing circuit 102 or connected to the digital processing circuit 102 via a communication channel, such as a system bus of the processing system 10. For example, the system bus may comprise one or more bus systems, e.g., based on the Advanced extensible Interface (AXI) bus architecture, and/or a Network-on-Chip (NoC).

Similarly, the memories 104 and/or 104b may be integrated with the digital processing circuit 102 in a single integrated circuit, or the memories 104 and/or 104b may be in the form of a separate integrated circuit and connected to the digital processing circuit 102, e.g., via the traces of a printed circuit board.

In the example considered, the digital processing circuit 102 may have associated one or more (hardware) resources/peripherals 106 selected from the group of:

one or more communication interfaces IF, e.g., for exchanging data via the communication system 20, such as a Universal asynchronous receiver/transmitter (UART), Serial Peripheral Interface Bus (SPI), Inter-Integrated Circuit (I2C), Controller Area Network (CAN) bus, and/or Ethernet interface, and/or a debug interface; and/or one or more analog-to-digital converters AD and/or digital-to-analog converters DA; and/or one or more dedicated digital components DC, such as hardware timers and/or counters, or a cryptographic co-processor; and/or one or more analog components AC, such as comparators, sensors, such as a temperature sensor, etc.; and/or one or more mixed signal components MSC, such as a PWM (Pulse-Width Modulation) driver.

For example, for this purpose, the system bus may indeed comprise an Advanced Microcontroller Bus Architecture (AMBA) High-performance Bus (AHB), and an Advanced Peripheral Bus (APB) used to connect the resources/peripherals 106 to the AMBA AHB bus.

Accordingly, the digital processing system 10 may support different functionalities. For example, the behavior of the digital processing circuit 102 is determined by the firmware stored in the memory 104, e.g., the software instructions to be executed by a microprocessor 102 of a micro-controller 10. Thus, by installing a different firmware, the same hardware (micro-controller) can be used for different applications.

As mentioned before, in many applications, data have to be exchanged between several processing systems 10 via a communication channel 20. For example, in the automotive sector, and also in many other areas, one or more CAN buses are often used to exchange data between the processing systems 10. More specifically, in many applications, the processing system 10 should be connected to a CAN FD Light bus. For example, the CAN FD Light protocol is described in documents "CAN FD Light Specification and test plan", CAN in Automation (CiA) 604-1, version 1.0.0, or "CANFD Light Network Protocol and Implementation", EuES003-06, version 1.3, which are incorporated herein by reference.

For example, FIG. 3 shows a typical situation, where a first processing system $10_1$ and a second processing system $10_2$ are connected to a CAN FD Light bus 20.

For example, each of the processing systems $10_1$ and $10_2$, may comprise:

a CAN FD bus transceiver 320 configured to be connected to the CAN bus 20;

a processing unit 102; and a communication interface IF configured to connect the processing unit 102 to the CAN bus transceiver 320;

For example, such additional CAN bus transceivers 320 are usually required, because the CAN bus 20 uses different signal levels than the processing unit 102 and/or in order to implement a galvanic isolation. For example, in case of the CAN FD Light protocol, the transceivers 320 are Controller Area Network Flexible Data-Rate (CAN FD) transceivers.

For example, conventional CAN FD bus transceivers 320 comprises two interfaces. The first interface is configured to exchange data via the CAN bus 20 by transmitting and receiving differential non-return-to-zero (NRZ) encoded signals. Conversely, the second interface is configured to receive a transmission signal TXD and provide a reception signal RXD, wherein the transmission signal TXD and the reception signal RXD are NRZ signals, preferably unipolar non-return-to-zero level (NRZ-L) encoded signals, such as binary-encoded signals being set to high (typically the supply voltage of the processing unit 102) for transmitting a logic "1" or low (typically ground) for transmitting a logic "0".

Generally, the transceivers 320 may be provided in the form of a separate integrated circuit 32 connected to an integrated circuit 30 comprising the digital processing circuit 102 and the hardware interface IF (see, e.g., processing system 10₁), or the transceivers 320 may be integrated in the integrated circuit 30 comprising the digital processing circuit 102, and the hardware interface IF (see, e.g., processing system 10₂). Generally, the hardware interface IF may also be integrated in the integrated circuit 32 of the transceiver 320.

For example, FIG. 4 shows a possible example of a CAN bus 20, in particular the physical layer as specified in ISO 11898-2.

Specifically, in the example considered, the CAN bus is implemented via two wires CANH and CANL, which are terminated at both ends via respective termination resistances $R_T$, which in case of a CAN bus have usually 120 n.

FIG. 5 shows in this respect an example of a CAN FD transceiver 320.

Specifically, the transceiver 320 comprises terminals RX and TX, such as pins/pads of an integrated circuit 32, for providing the reception signal RXD and receiving the transmission signal TXD. Moreover, the transceiver 320 comprises terminals, such as pins/pads, for connecting the transceiver 320 to the lines CANH and CANL.

According to the CAN FD standard, the transceiver 320 is configure to receive a NRZ (e.g., NRZ-L) encoded transmission signal TXD, such as a binary bit sequence. In the example considered, the transceiver 320 comprises thus a CAN FD transmitter circuit 322, wherein the transmitter circuit 322 is configured to selectively apply differential voltages to the lines CANH and CANL, e.g., by selectively connecting:

the terminal/line CANH via a first electronic switch $SW_H$ to a first supply voltage $V_P$, and the terminal/line CANL via a second electronic switch $SW_L$ to a second supply voltage $V_N$, wherein the second supply voltage $V_N$ is smaller than the first supply voltage $V_P$.

Logical signals ('0' and '1') are transmitted via the CAN bus 20 with the electrical levels "dominant" and "recessive". For example, the dominant level may be transmitted by closing via the driver 322 the switches $SW_H$ and $SW_L$. In this state, a current flows from the voltage $V_P$/switch $SW_H$ over the CANH wire through the termination resistors $R_T$ via the CANL wire to the switch $SW_L$/voltage $V_N$. This current results in a first differential voltage between the wires CANH and CANL. For transmitting the recessive signal, the driver 322 may open the switches $SW_H$ and $SW_L$. Thus, when all processing systems transmit the recessive level, no current flows through the termination resistances $R_T$ resulting in a second differential voltage between the lines CANH and CANL, which is smaller than the first differential voltage and is, e.g., zero or in any case small. As a result of this implementation a dominant level always overrides a recessive level, i.e., at least one driver 320 sending a dominant level will force the dominant level on the entire bus 20. For example, according to ISO 11898-2 a dominant level is interpreted as a logic '0' and a recessive signal is interpreted as a logic '1'.

The transceiver 320 comprises thus also a CAN FD receiver circuit 324 configured to generate the reception signal RXD by analyzing the differential voltage between the terminals/wires CANH and CANL. Specifically, according to the CAN FD standard, also the signal RXD is a NRZ encoded signals, such as binary encoded signals, used to indicate the logic level of the CAN bus 20, i.e., the dominant level ('0') or the recessive level ('1').

Generally, each processing system 10 implementing a CAN FD Light protocol controller should usually be able to manage both the transmission and the reception of a CAN FD light frame. In fact, a processing system 10/CAN FD Light controller may be a CAN FD Light master circuit (commander) or a CAN FD Light slave circuit (responder). Specifically, in case of a CAN FD Light commander, the processing system 10 transmits first a CAN FD Light frame and, in case the CAN FD Light frame includes a request expecting a response, the processing system 10 will then receive a response CAN FD Light frame. Conversely, in case of a CAN FD Light responder, the processing system 10 will first receive a CAN FD Light frame and, in case the received CAN FD Light frame correspond to a request expecting a response from the CAN FD Light responder, the processing system 10 will then transmit a response CAN FD Light frame.

Accordingly, a CAN transceiver 320 essentially converts the voltage levels of the signals, while the CAN FD Light protocol management and the respective timing of the signals is implemented in the CAN FD Light controller implemented in the processing system 10. Generally, the communication interface IF implements at least the data link layer. Conversely, the further higher protocol layers (e.g., used to implement a CAN FD Light protocol controller) may be implemented in any suitable manner within the communication interface IF and/or the processing circuit 102. For example, Italian Patent Applications 102021000022037 and 102021000022124, which are incorporated herein by reference for this purpose, disclose possible solutions for implementing such a CAN FD Light controller and the communication interface IF in a microcontroller 10.

Therefore, according to the CAN FD Light standard, each processing system 10 connected to the CAN FD Light bus 20 requires a respective CAN FD transceiver 320.

The inventors have observed that processing systems 10, such as the ECUs of a vehicle, may comprise also a plurality of processing units 102, which may be integrated in the same integrated circuit or provided as separate integrated circuits and connected together on a common printed circuit board. Accordingly, one or more of such processing units may be configured to exchange data on a CAN FD Light bus 20, e.g., for communication with other processing units 102 of the same processing system 10 or with other processing systems 10. Accordingly, in this case, providing a CAN FD transceiver 320 for each of these processing units may involve significant costs.

SUMMARY

Embodiments provide solutions for managing the communication on a CAN FD Light bus, which does not require a CAN FD transceiver for each processing unit.

As mentioned before, various embodiments of the present disclosure relate to a processing system comprising a sub-circuit comprising a CAN FD Light controller. Specifically, in various embodiments, the processing system comprises a positive supply terminal and a negative supply terminal configured to be connected to a supply voltage. Moreover, in various embodiments, the sub-circuit comprises a transmission terminal and a three-state driver circuit. For example, the three-state driver circuit may comprise a first electronic switch connected between the transmission terminal and the positive supply terminal and a second electronic switch connected between the transmission terminal and the negative supply terminal. The three-state driver circuit comprises also a combinational logic circuit configured to monitor the logic levels of a first signal and a second signal, and selectively activate one of a plurality of switching states as a function of the logic levels of the first signal and the second signal. Specifically, in a first switching state, the three-state driver circuit connects the transmission terminal to the positive supply terminal by closing the first electronic switch. In a second switching state, the three-state driver circuit connects the transmission terminal to the negative supply terminal by closing the second electronic switch. Finally, in a third switching state, the three-state driver circuit puts the transmission terminal in a high-impedance state by opening the first electronic switch and the second electronic switch.

For example, for this purpose, the combinational logic circuit of the three-state driver circuit may be configured to activate the second switching state when the first signal is de-asserted, activate the first switching state when the first signal is asserted and the second signal is asserted, and activate the third switching state when the first signal is asserted and the second signal is de-asserted. Alternatively, the combinational logic circuit of the three-state driver circuit may be configured to activate the second switching state when the first signal is de-asserted and the second signal is asserted, activate the first switching state when the first signal is asserted and the second signal is asserted, and activate the third switching state when the second signal is de-asserted.

In various embodiments, the CAN FD Light controller is configured to sequentially transmit the bits of a CAN FD Light frame. Generally, a CAN FD Light frame comprises a start-of-frame bit, a sequence of bits comprising in sequence a Cyclic Redundancy Check (CRC) delimiter bit, an acknowledge bit, an acknowledge delimiter bit and an End-of-Frame field having 7 bits, and a plurality of intermediate bits between the start-of-frame bit and the CRC delimiter bit.

Specifically, in various embodiments, the CAN FD Light controller supports one or more operating modes to sequentially transmit the bits of the CAN FD Light frame by generating the first signal and the second signal in response to a transmission clock signal.

Specifically, in a first operating mode, the CAN FD Light controller is configured to transmit the start-of-frame bit by activating the second switching state for one clock cycle, sequentially transmit the intermediate bits by sequentially selecting a bit of the intermediate bits and activating the first or the second switching state as a function of the logic level of the selected bit, and once having transmitted the intermediate bits activate the third switching state. Accordingly, in this case, the CAN FD Light controller activates the high impedance state once having transmitted the intermediate bits. Preferably, the CAN FD Light controller activates the third switching state at the end of the last bit of the intermediate bits or during the CRC delimiter bit. For example, by maintaining the third switching state for ten clock cycles, the CRC delimiter bit, the acknowledge bit, the acknowledge delimiter bit and the End-of-Frame field may be transmitted. However, the CAN FD Light controller may also just activate the high impedance state without waiting explicitly for ten clock cycles.

Accordingly, in the first operating mode, the CAN FD Light controller is configured to use the push-pull configuration of the three-state driver for transmitting the start-of-frame bit and the intermediate bits and then activates the high impedance state once having transmitted the intermediate bits, e.g., at the end of the last bit of the intermediate bits or during the CRC delimiter bit. For example, in case of the previously mentioned embodiments of three-state driver circuits, the CAN FD Light controller may be configured to generate a transmission signal corresponding to the first signal by sequentially providing the bits of the CAN FD Light frame in response to the transmission clock signal, and assert the second signal when providing the start-of-frame bit and the intermediate bits, and de-assert the second signal, e.g., at the end of the last bit of the intermediate bits or during the CRC delimiter bit.

For example, in order to generate the transmission signal, the CAN FD Light controller may comprise a digital processing circuit configured to generate a frame comprising at least the intermediate bits of the CAN FD Light frame and a serial communication interface. For example, the serial communication interface may comprise a control register configured to store data identifying a requested number of bits, a clock management circuit configured to receive a system clock signal and generate a down-scaled clock signal corresponding to the transmission clock signal, and a transmission shift register configured to, when a transmission enable signal is asserted, generate the transmission signal by sequentially providing the content of the transmission shift register in response to the transmission clock signal. Accordingly, in this case, the processing system may be configured to selectively transfer the frame from the digital processing circuit to the transmission shift register, and a transmission control circuit may be configured to receive a start of transmission signal requesting the transmission of data and then assert the transmission enable signal. Moreover, when the transmission enable signal is asserted, the transmission control circuit increases a transmission count value in response to the transmission clock signal and determines whether the transmission count value reaches the requested number of bits. Accordingly, in response to determining that the transmission count value reaches the requested number of bits, the transmission control circuit may de-assert the transmission enable signal. For example, in this case, the transmission control circuit may be configured to assert the second signal in response to the start of transmission signal, determine whether the serial communication interface provides the last bit of the intermediate bits, and then de-assert again the second signal.

In various embodiments, the processing system comprises also a reception terminal and the CAN FD Light controller is configured to sequentially receive the bits of a further CAN FD Light frame via the reception terminal. Such a processing system may be used in different application scenarios. For example, in a first scenario, the processing system comprises also a CAN FD transceiver comprising a transmission terminal and a reception terminal, wherein the transmission terminal of the CAN FD transceiver is connected to the transmission terminal of the sub-circuit and the reception terminal of the CAN FD transceiver is connected to the reception terminal of the sub-circuit, i.e., the sub-circuit comprising the CAN FD Light controller is connected to a CAN FD transceiver. However, when using the first operating mode, the processing system may also comprise a further sub-circuit, wherein also the further sub-circuit comprises a further transmission terminal, a further reception terminal, a further three-state driver circuit and a further CAN FD Light controller, and wherein the further transmission terminal of the further sub-circuit is connected to the transmission terminal of the sub-circuit and the reception terminal of the further sub-circuit is connected to the reception terminal of the sub-circuit. Specifically, as will be described in greater detail in the following, in this case, by connecting a pull-up resistance between the transmission terminal of the sub-circuit and the positive supply terminal, the two sub-circuits may exchange data by transmitting at least the intermediate bits of the CAN FD Light frames with the push-pull configuration, thereby permitting a higher transmission speed than conventional configurations of CAN controllers using a shared pull-up resistance.

Alternatively, the CAN FD transceiver may be omitted and the further transmission terminal of the further sub-circuit may be connected to the transmission terminal of the sub-circuit, the reception terminal of the further sub-circuit may be connected to the transmission terminal of the further sub-circuit and the reception terminal of the sub-circuit may be connected to the transmission terminal of the sub-circuit. Thus, also in this case, the two sub-circuits may exchange data by transmitting at least the intermediate bits of the CAN FD Light frames with the push-pull configuration.

In various embodiments, the processing system may also support a second operating mode, which may be used when the further sub-circuit is omitted and the transmission terminal of the CAN FD transceiver is connected to the transmission terminal of the sub-circuit and the reception terminal of the CAN FD transceiver is connected to the reception terminal of the sub-circuit. Specifically, in this case, the CAN FD Light controller may always use the push-pull configuration, i.e., transmit the start-of-frame bit by activating the second switching state for one clock cycle, sequentially transmit the intermediate bits by sequentially selecting a bit of the intermediate bits and activating the first or the second switching state as a function of the logic level of the selected bit, and once having transmitted the intermediate bits activate the first switching state. For example, in this case, the transmission control circuit may not assert the second signal.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 6 to 16 parts, elements or components which have already been described with reference to FIGS. 1 to 5 are denoted by the same references previously used in such Figure; the description of such previously described elements will not be repeated in the following in order not to overburden the present detailed description.

Figure 1:
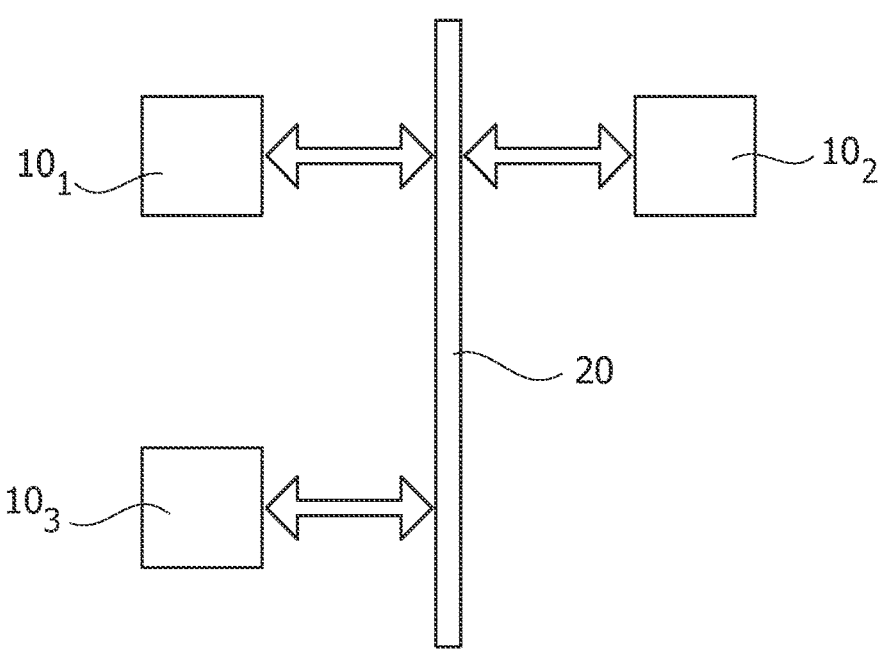
FIG. 1 shows an example of an electronic system comprising a plurality of processing systems.
Figure 2:
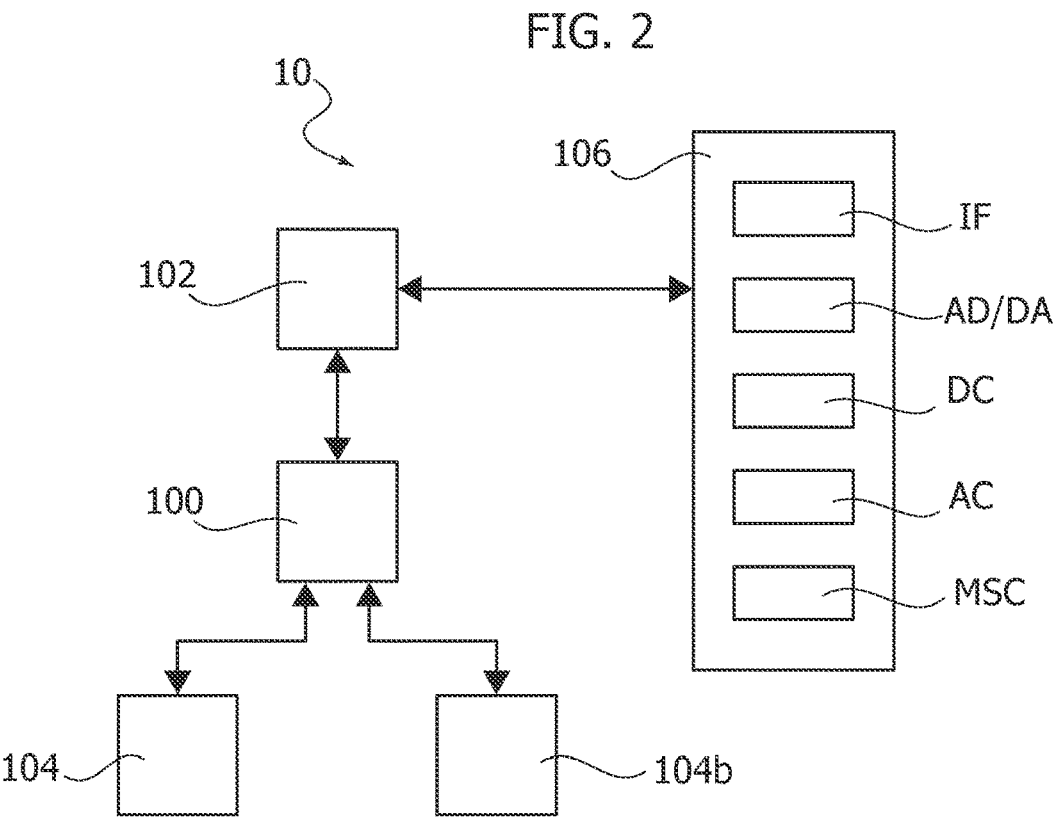
FIG. 2 shows an example of a processing system.
Figure 3:
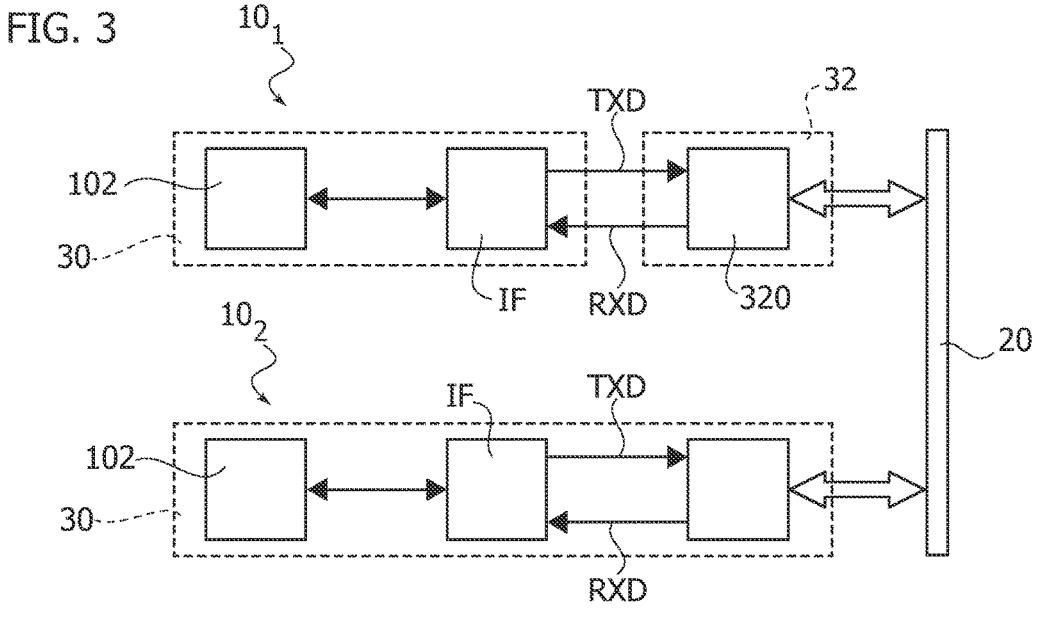
FIG. 3 shows an example of a CAN FD Light communication system.
Figure 4:
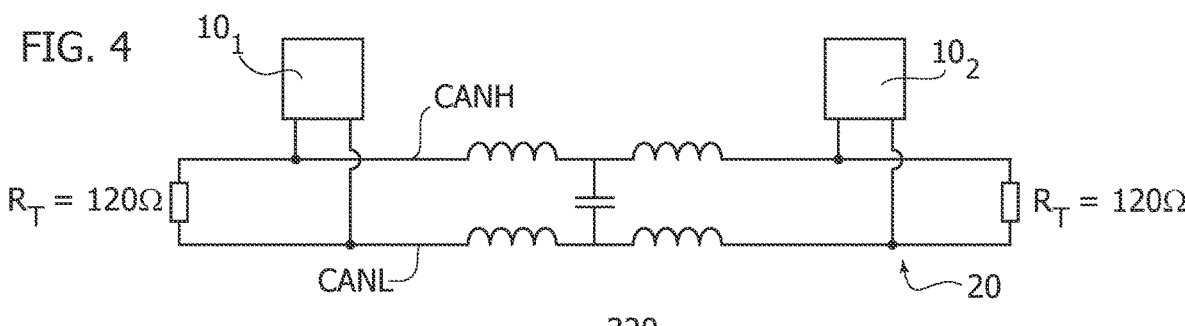
FIG. 4 shows an example of a CAN bus.
Figure 5:
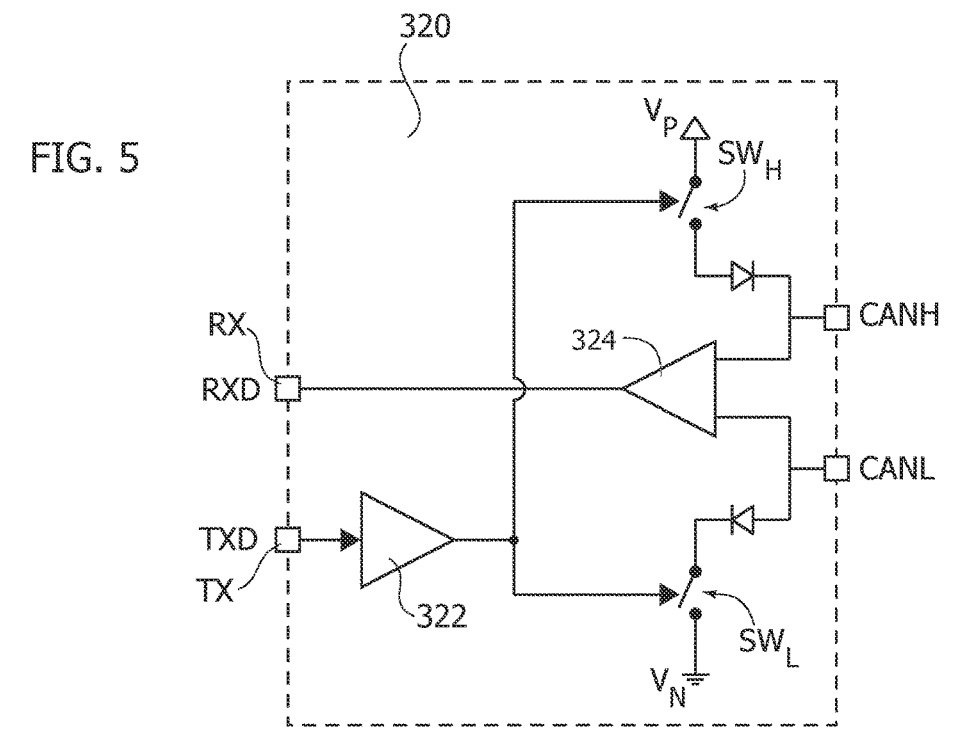
FIG. 5 shows an example of a CAN FD transceiver.

As described in the forgoing with respect to FIGS. 1 to 5, in many applications, a plurality of CAN FD Light controllers may be connected to a CAN FD Light bus 20. As shown in FIG. 3, in this case each CAN FD Light controller is connected to the CAN FD Light bus 20 via a respective transceiver 320.

Specifically, as described in the foregoing, each CAN FD Light controller provides a NRZ encoded transmission signal TXD. Specifically, in various embodiments, the NRZ encoded signals TXD and RXD are non-return to zero encoded signals (NRZ-L), wherein a first voltage (typically the supply voltage of the CAN FD Light protocol controller, in particular the communication interface IF) indicates a first logic level (typically '1') and a second voltage (typically the ground level of the CAN FD Light protocol controller, in particular the communication interface IF) indicates a second logic level (typically '0').

The inventors have observed, that the above behavior may be used to exchange data between two CAN FD Light controllers, without using a CAN bus transceiver 320, or by sharing a common CAN bus transceiver 320. In fact, for short distances, e.g., within the same processing system, such as within the same printed circuit board, embedded system, or integrated circuit, the bits according to the CAN FD Light standard may still be reliably transmitted via NRZ encoded signals TXD and RXD, without using a CAN bus transceiver 320, which is required to transmit data over longer distances. A similar solution is disclosed in the context of a CAN XL bus in Italian Patent Application 102020000030434, which is incorporated herein by reference for this purpose.

Figure 6:
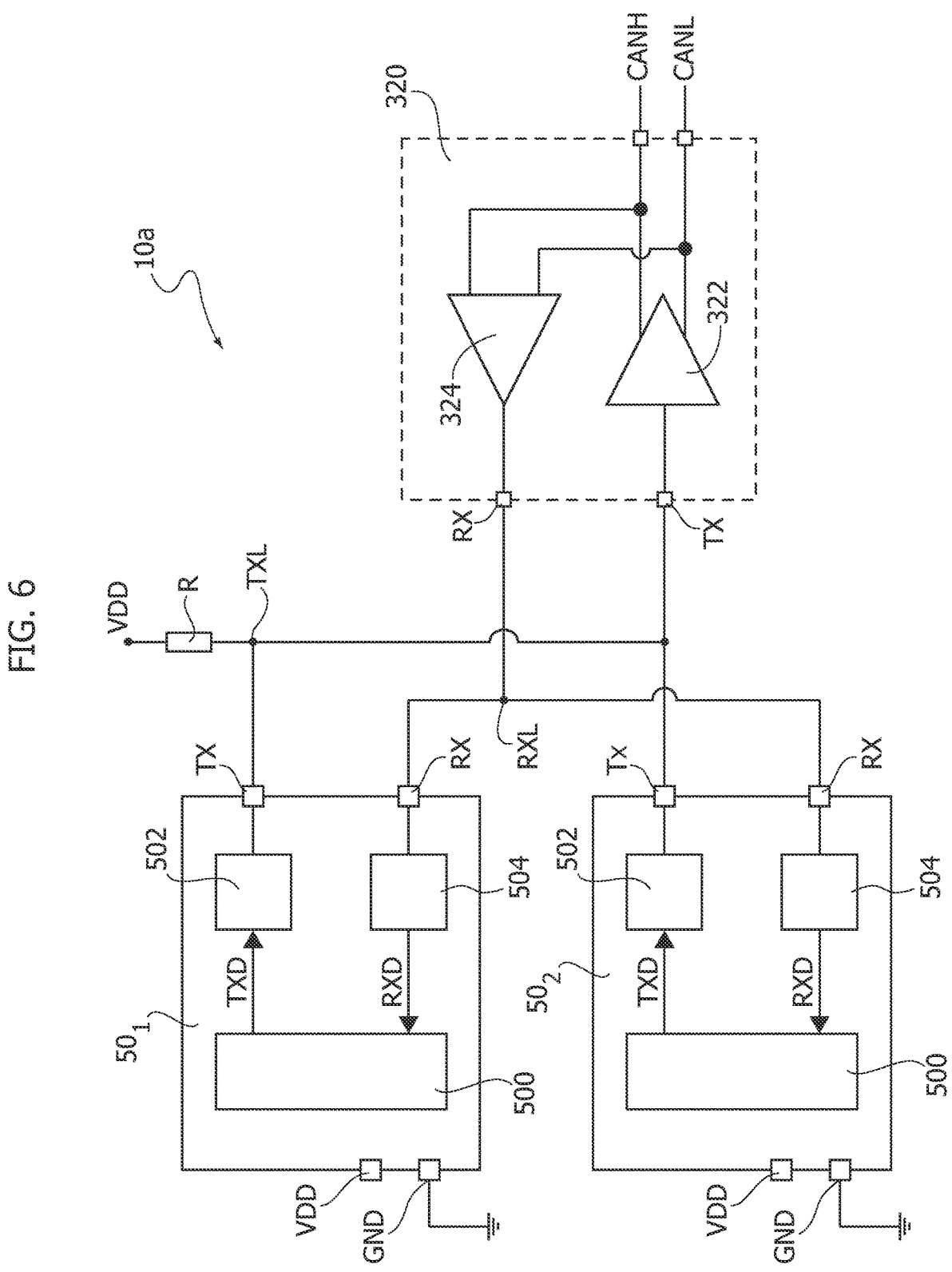
FIG. 6 shows an embodiment of two CAN FD Light controllers connected to a shared CAN FD transceiver.

Specifically, FIG. 6 shows an embodiment of a processing system 10a comprising a plurality of integrated circuits 50, such as integrated circuits $50_1$ and $50_2$, wherein each integrated circuit 50 comprise a respective CAN FD Light controller 500. As described in the foregoing, such CAN FD Light controllers 500 may be implemented with a communication interface IF and a CAN FD Light protocol controller, e.g., implemented with a microprocessor 102, i.e., the integrated circuits 50 may be microcontrollers. In general, the CAN FD Light controllers 500 could also be provided as sub-circuits 50 of the same integrated circuit. For example, the CAN FD Light protocol controller of the circuit $50_1$ may be a commander and the CAN FD Light protocol controller of the circuit $50_2$ may be a responder.

In the embodiment considered, each circuit 50 comprises a transmission terminal TX and a reception terminal RX. Specifically, in the embodiment considered, the transmission terminals TX of the various circuits 50 are connected (e.g., directly) to a (common) transmission node or line TXL. Moreover, the transmission node or line TXL is connected via a pull-up resistor R to a supply voltage VDD. For example, the supply voltage VDD may correspond to the supply voltage of the circuits 50, as schematically shown via the terminals VDD and GND of the circuit 501. Generally, the pull-up resistance R may be integrated also within one of the circuits 50, or may be implemented with pull-up resistors within each (or at least a subset of) the circuits 50.

As described in the foregoing, each of the CAN FD Light controllers 500 may generated a binary transmission signal TXD and receive a binary reception signal RXD. However, in the embodiment considered, in order to not transmit data or transmit a recessive level, a circuit 50 should apply a high-impedance state to the respective terminal TX. Conversely, in order to transmit a dominant level, a circuit 50 should pull the respective terminal TX to ground.

Accordingly, in various embodiments, each circuit 50 comprises a driver circuit 502 configured to drive the respective terminal TX as a function of the respective transmission signal TXD.

Figures 7, 8:
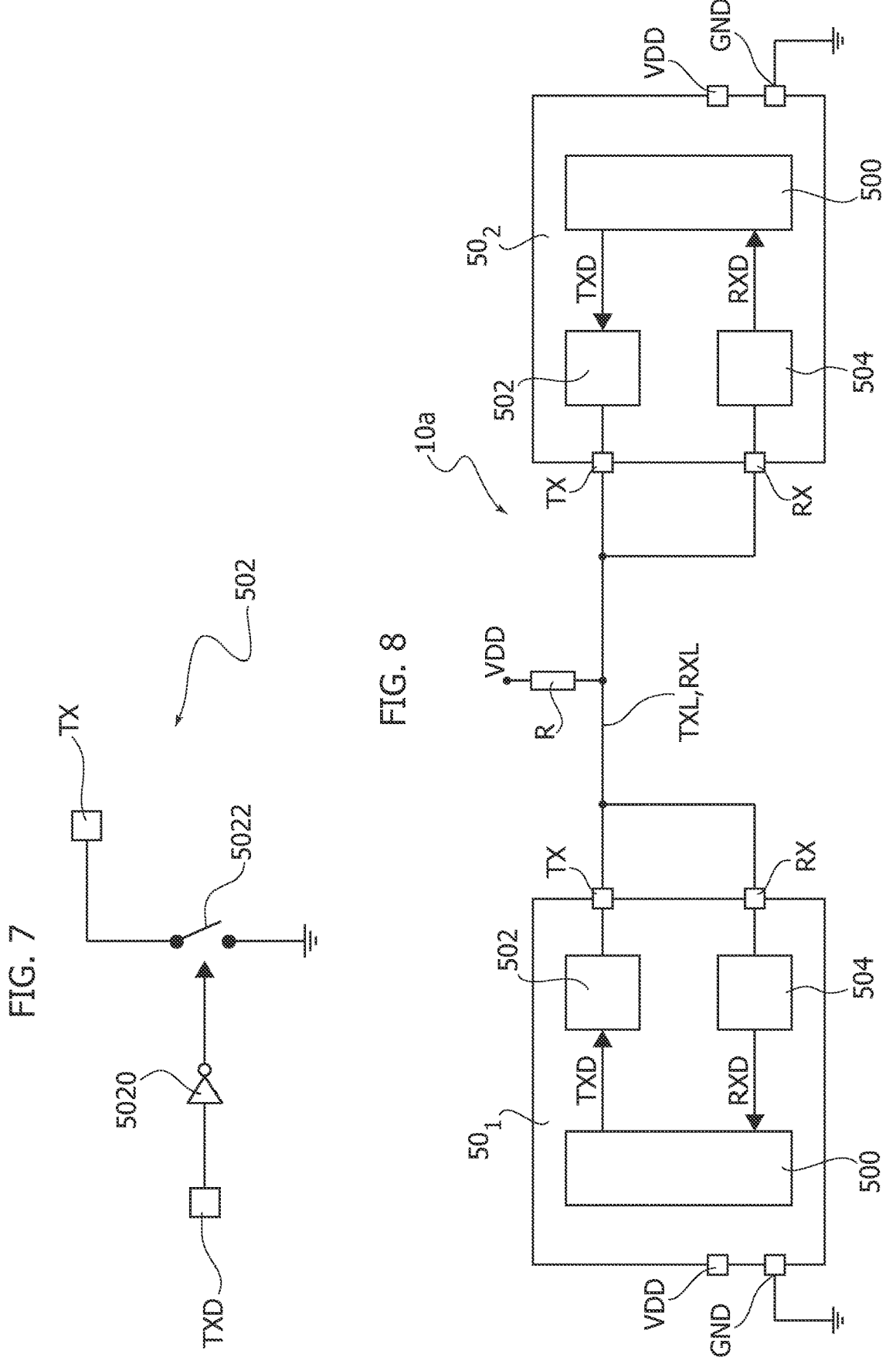
FIG. 7 shows an embodiment of an open-drain driver circuit for a CAN FD Light controller of FIG. 6.
FIG. 8 shows an embodiment of two CAN FD Light controllers connected to a common line without a CAN FD Light transceiver.

As shown in FIG. 7, such driver circuits 502 are configured to receive at an input terminal a respective transmission signal TXD and set the respective transmission terminal TX to floating (high-impedance state) or to ground GND.

For example, as shown in FIG. 7, for this reason, the terminal TX may be connected (e.g., directly) via (the current path of) an electronic switch 5022, such as a Field Effect Transistor (FET), to ground GND. Moreover, the control terminal (e.g., the gate terminal of a FET) may be driven as a function of the signal TXD applied to the terminal TX. For example, in the embodiment considered, the electronic switch 5022 is driven via the inverted version of the signal TXD, as schematically shown via an inverter 5020. Accordingly, when the signal TXD is low, the electronic switch 5022 is closed and the terminal TX is short-circuited to ground. Conversely, when the signal TXD is high, the electronic switch 5022 is opened and the terminal TX is floating. For example, when the electronic switch is a FET, the driver circuit 502 is usually called open drain driver circuit, because the drain terminal may remain opened. Accordingly, the open-drain drivers 502 and the pull-up resistance R implement a logic AND operation, wherein the line/node TXL is set to '0' when at least one of the signals TXD is set to '0'.

Accordingly, a CAN FD transceiver 320 may drive the lines CANH and CANL as a function of the voltage at the respective terminal TX, which is connected to the transmission node/line TXL, i.e., apply the dominant level to the lines CANH and CANL when the voltage at the transmission node/line TXL is smaller than a given threshold (being smaller than the supply voltage VDD), thereby transmitting the logic levels of the signal TXD to possible other circuits connected to the CAN bus 20.

Conversely, in order to receive a CAN FD Light frame, the CAN FD transceiver 320, in particular the receiver circuit 324, sets the respective terminal RX to high or low as a function of the differential voltage between the terminals/liens CANH and CANL. Accordingly, in the embodiment considered, the reception terminals RX of the various circuits 50 and the terminal RX of the transceiver 320 are connected (e.g., directly) to a (common) reception node or line RXL.

Accordingly, the shared transmission line TXL with pull-up resistance R, the open drain driver circuits 502 and the shared reception line RXL essentially implement as bus. Accordingly, in this way, a plurality of circuits 50 may drive the transmission line/node TXL in order to transmit data and monitor the logic level of the reception line/node RXL in order to receive data. Accordingly, in various embodiments, each circuit 50 may comprise an optional input circuit 504, e.g., implemented with one or more inverters and/or Schmitt trigger, in order to generate the reception signal RXD of a circuit 50 as a function of the voltage at the respective terminal RX. Generally, the input circuit 504 is purely optional, and the signal RXD could also correspond directly to the voltage at the respective terminal RX, e.g., in case the circuits 500 and 324 use the same supply voltage and are integrated in the same integrated circuit.

The processing system 10a shown in FIG. 6 may also be used to transmit one CAN FD Light frame from the circuit $50_1$ to the circuit $50_2$ (or vice versa). In fact, once the circuit $50_1$ sequentially applies the bits of a CAN FD Light frame to the transmission line/node TXL, the transmitter circuit 322 of the CAN FD transceiver will apply the respective dominant or recessive level to the CAN bus 20. However, the receiver circuit 324 will sample the level of the CAN bus 20 and drive the reception line/node RXL, thereby providing a feedback to the circuit 502.

As shown in FIG. 8, in various embodiments, the CAN FD transceiver 320 may also be omitted, e.g., in case data have to be exchanged only between circuits 50 connected to the transmission and reception nodes/lines TXL and RXL. However, in this case, due to the lack of a feedback via the CAN FD transceiver 320, the reception node/line RXL is connected (e.g., directly) to the transmission node/line TXL. For example, the connection between the transmission and reception nodes/lines TXL and RXL may be implemented by connecting the terminal RX of at least one of the circuits 50 to the respective terminal TX.

Figure 9:
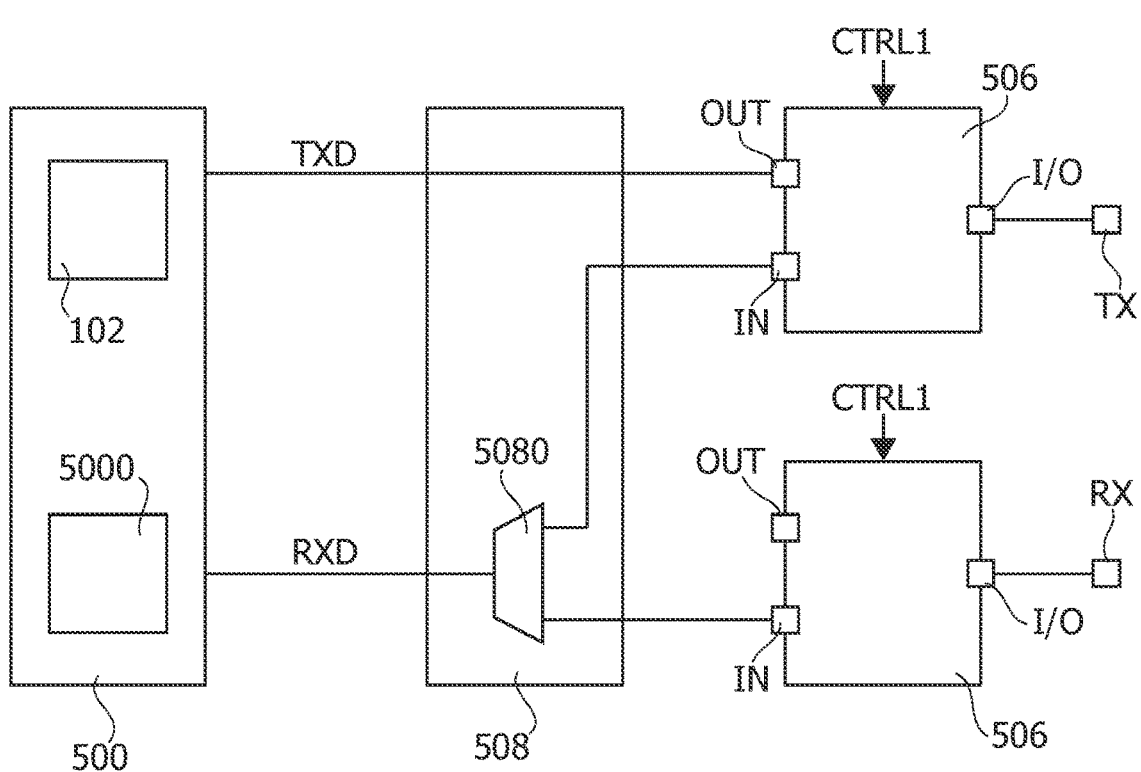
FIGS. 9 and 10 show an embodiment of a configurable CAN FD Light controller.

For example, FIG. 9 shows an embodiment of a circuit 50, such as a microcontroller.

Specifically, again the circuit 50 comprises at least one CAN FD Light controller 500, which may comprise a serial communication interface 5000 and a digital processing circuit 102 implementing a CAN FD Light protocol controller.

However, in the embodiment considered, the driver circuit 502 and/or the receiver circuit 504 are implemented via the circuits 506 of one or more programmable/configurable input/output terminals I/O, such as input/output pads of an integrated circuit 50 or pins of a packaged integrated circuit 50, such as general-purpose input/output terminals.

Figure 10:
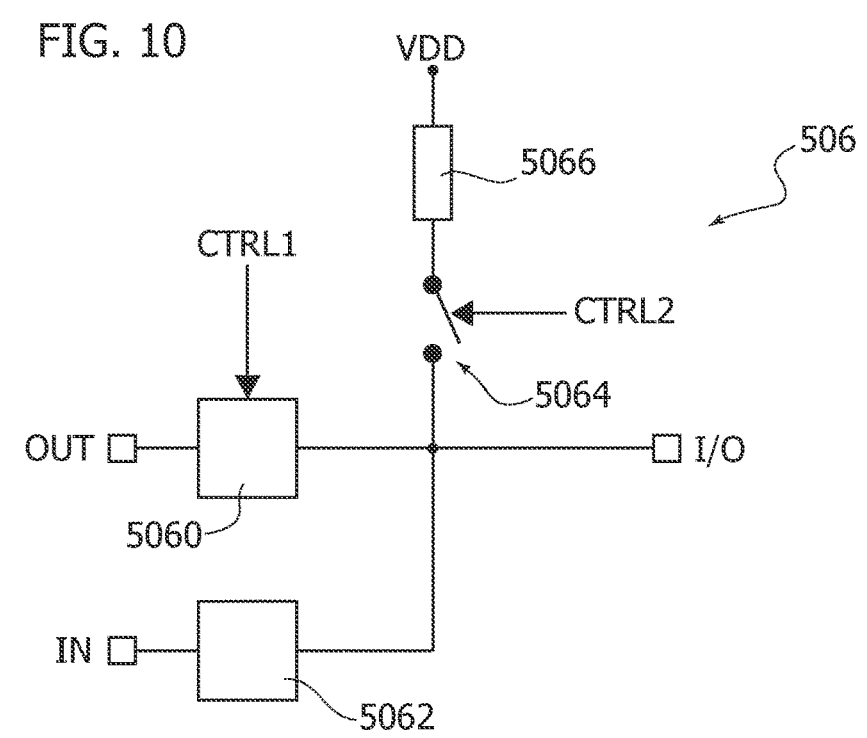

For example, FIG. 10 shows an embodiment of the input/output circuit 506.

Specifically, in the embodiment considered, the circuit 506 comprises a three-state driver circuit 5060.

Figure 11:
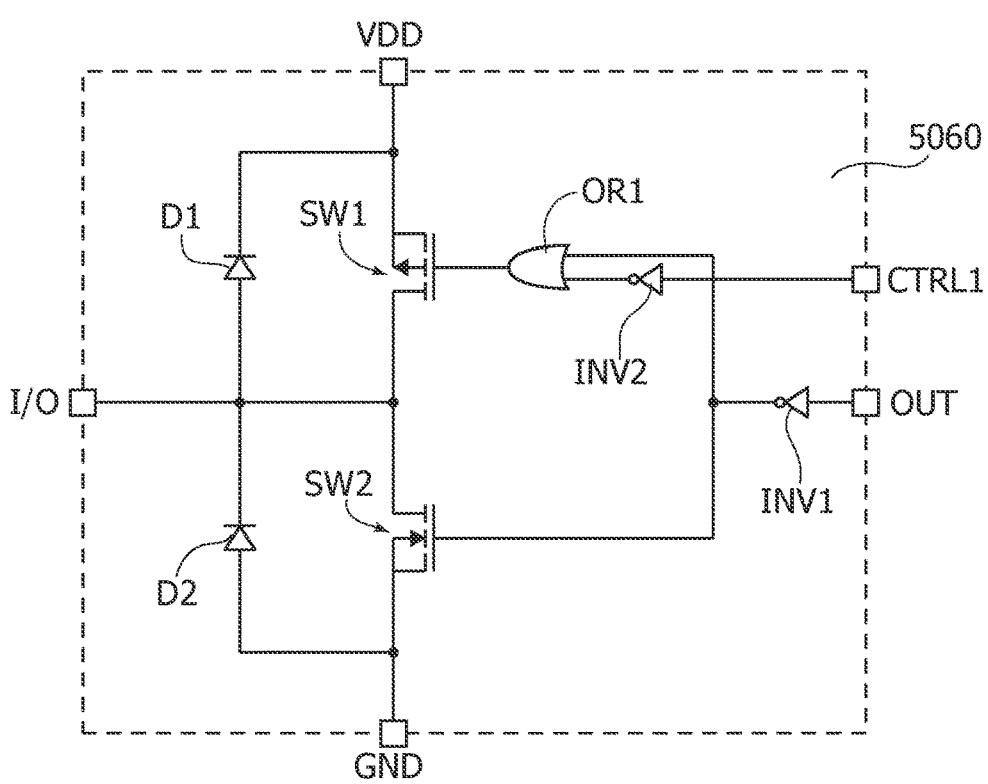
FIGS. 11 and 12 show two embodiments of output driver circuits for a CAN FD Light controller according to FIGS. 6 to 10.

For example, FIG. 11 shows a first embodiment of the three-state driver circuit 5060.

Specifically, in the embodiment considered, the three-state driver circuit 5060 comprises two electronic switches SW1 and SW2 connected (e.g., directly) in series between the supply voltage VDD and ground GND, wherein the intermediate node between the two electronic switches SW1 and SW2 is connected (e.g., directly) to the terminal I/O. For example, the switch SW1 may be a p-channel FET, such as a PMOS, and the switch SW2 may be a n-channel FET, such as an NMOS. In various embodiments, optional clamping diodes D1 and D2 may be connected between the terminal I/O and the supply voltage VDD, and the terminal I/O and ground GND, respectively, In the embodiment considered, the control (e.g., gate) terminals of the electronic switches SW1 and SW2 are driven via a combinational logic circuit as a function of a signal OUT and a control signal CTRL1. For example, in the embodiment considered, the combinational logic circuit is configured to:

when the control signal CTRL1 has a first logic level (e.g., high), set the terminal I/O to high or low as a function of the signal OUT, e.g., by connecting via the electronic switches SW1 and SW2 the terminal I/O to the supply voltage VDD or ground GND, respectively, thereby implementing a so-called push-pull configuration; and when the control signal CTRL1 has a second logic level (e.g., low), set the terminal I/O to the high-impedance state or low as a function of the signal OUT, thereby implementing an open-drain driver configuration (see also the description of FIG. 7).

For example, in the embodiment considered, the switch SW2 is closed, when the signal OUT is low, as schematically shown via an inverter INV1. Conversely, in order to selectively use the push-pull or open-drain driver configuration when the signal OUT is high, the switch SW1 is only closed when the signal OUT is high and the control signal CTRL1 has a given logic level, e.g., high. For example, in the embodiment considered, the gate terminal of the p-channel FET SW1 is driven via an OR gate OR1 receiving at input the inverted version of the signal OUT and the inverted version of the signal CTRL1, e.g., generated via a further inverter INV2.

Accordingly, in the embodiment considered, the control signal CTRL1 represents a mode selection signal, which permits to select the push-pull or open-drain driver mode of operation of the driver circuit 5060.

Figure 12:
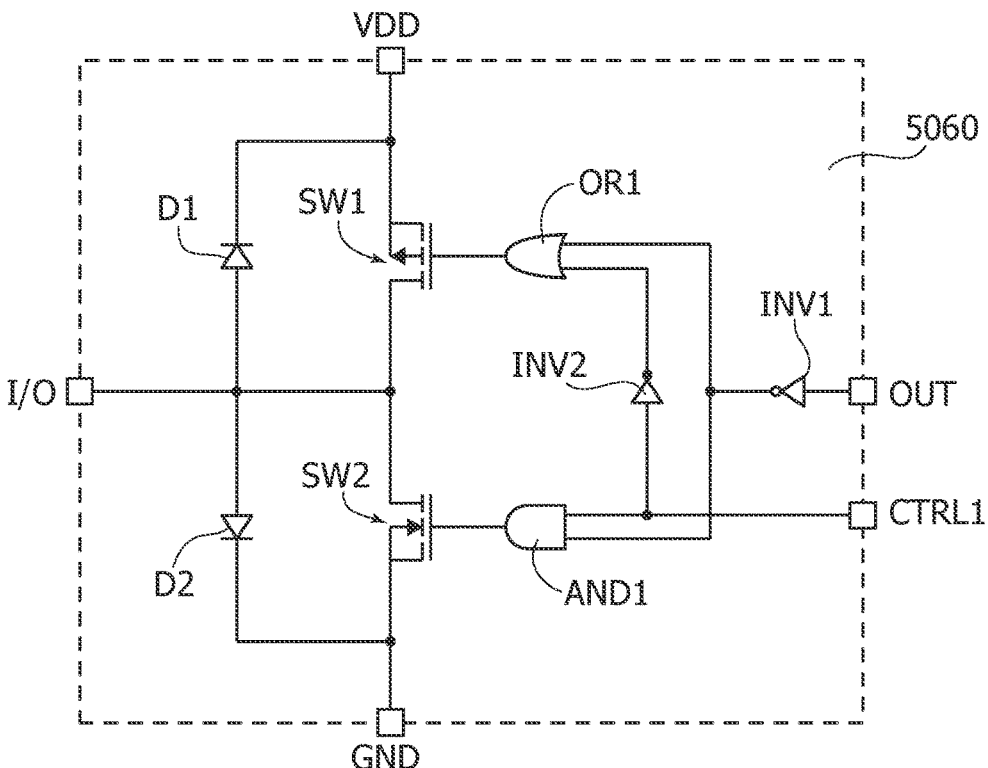

Conversely, FIG. 12 shows a second embodiment of the driver circuit 5060. Compared to FIG. 11, the combinational logic circuit is in this case configured to:

when the control signal CTRL1 has a first logic level (e.g., high), set the terminal I/O to high or low as a function of the signal OUT, e.g., by connecting via the electronic switches SW1 and SW2 the terminal I/O to the supply voltage VDD or ground GND, respectively, thereby implementing the push-pull configuration; and when the control signal CTRL1 has a second logic level (e.g., low), put the terminal I/O in the high-impedance state, e.g., by maintaining the switches SW1 and SW2 opened.

For example, for this purpose, the gate terminal of the n-channel FET SW2 may be driven via an AND gate AND1 receiving at input the inverted version of the signal OUT and the signal CTRL1. For the rest, the combinational logic circuit used to drive the switch SW1 may correspond to the combinational circuit of FIG. 11.

Accordingly, in the embodiment considered, the control signal CTRL1 represents an enable signal, which permits to select the push-pull mode of operation of the driver circuit 5060 or disable the driver circuit 5060, whereby the terminal I/O is put in the high-impedance state.

Accordingly, in both cases the signals OUT and CTRL1 may be used to switch between three states '0', '1' and 'Z' (high impedance state), thereby implementing a push-pull or open-drain driving. For example, as described in the foregoing, the first (push-pull) configuration may be used when the CAN FD Light protocol controller 500 is connected to an individual CAN FD transceiver 320, and the second configuration (open-drain) may be used when a shared transmission node/line TXL is used.

As shown in FIG. 10, in various embodiments, the circuit 506 comprises also an input circuit 5062 configured to drive the logic level of a signal IN as a function of the voltage at the terminal I/O, e.g., set the signal IN to a first logic level (e.g., high), when the voltage at the terminal I/O is greater than an upper threshold and set the signal IN to second logic level (e.g., low, when the voltage at the terminal I/O is smaller than a lower threshold, wherein the lower threshold is smaller than or corresponds to the upper threshold. For example, the input circuit 5062 may comprise a comparator, a Schmitt trigger, and/or on or more inverter stages.

In various embodiments, the circuit 506 comprises also a pull-up resistor 5066, which preferably may be selectively enabled, e.g., by connecting the resistor 5066 between the supply voltage VDD and the terminal I/O as a function of a control signal CTRL2, as schematically shown via an electronic switch 5064.

Accordingly, the three-state driver circuit 5060 of a terminal I/O may be used to implement the circuit 502, e.g., by providing the signal TXD as signal OUT to the circuit 506 associated with a transmission terminal TX.

Moreover, the configuration of FIG. 6 may be implemented by using the input circuit 5062 of the circuit 506 associated with a further/reception terminal RX, e.g., by providing the signal IN of the circuit 506 associated with the reception terminal RX as signal RXD to the CAN FD Light protocol controller 500.

Conversely, the configuration of FIG. 8 may be implemented by using directly the input circuit 5062 of the circuit 506 associated with transmission terminal TX, e.g., by providing the signal IN of the circuit 506 associated with the transmission terminal TX as signal RXD to the CAN FD Light protocol controller 500. Alternatively, the configuration of FIG. 8 may be implemented by using the input circuit

5062 of the circuit 506 associated with a further/reception terminal RX, e.g., by providing the signal IN of the circuit 506 associated with the reception terminal RX as signal RXD to the CAN FD Light protocol controller 500, and connecting (e.g., externally) the terminal RX to the terminal TX.

As shown in FIG. 9, in various embodiments, the circuit 50 may thus comprise a switching circuit 508 configured to support both modes of operation, as schematically shown via a multiplexer 5080 configured to provide the signal RXD by selecting the signal IN of the circuit 506 associated with the terminal TX or the signal IN of the circuit 506 associated with the further terminal RX. In various embodiments, the switching circuit 508 may also be more complex and may permit to selectively connect the signals TXD and RXD to different terminals/ping/pads of the circuit 50.

Accordingly, by configurating the switching circuit 508 and setting the control signal CTRL1 and optionally the control signal CTRL2, e.g., via software instructions executed by a microprocessor 102 of the circuit 50, the circuit 50 may be configured according to any of the previous described operating modes (individual transceiver, shared transmission line with enabled or disabled pull-up resistor, separate reception line, etc.)

However, the inventors have observed that one of the main problems of sharing a common transmission node/line TXL by several CAN controllers 500 is that the transmission node/line TXL, and thus also the terminal TX of the transceiver 320 (when used), is only passively pulled to high (corresponding to the recessive level/logic '1'). This means that the rise time of the rising edge is determined by the capacitive load and the value of the pull-up resistance R (see also the description of the resistor 5066 in FIG. 10). Lowering the resistance value R to speed up the rising edge means that stronger pull-down transistors, such as the transistors SW2 shown in FIGS. 11 and 12, are required to pull the voltage at the transmission line/node TXL to ground GND. And in turn larger transistors have a higher capacitance that increases the capacitive load of the transmission line/node TXL. This may limit the number of CAN controllers 500 that can share the same transmission line/node TXL and the achievable data rate. Slower slopes are usually also more sensitive to distortions, either caused by electromagnetic interference or by power-supply distortions (i.e., "ISO-pulses").

Figure 13A:
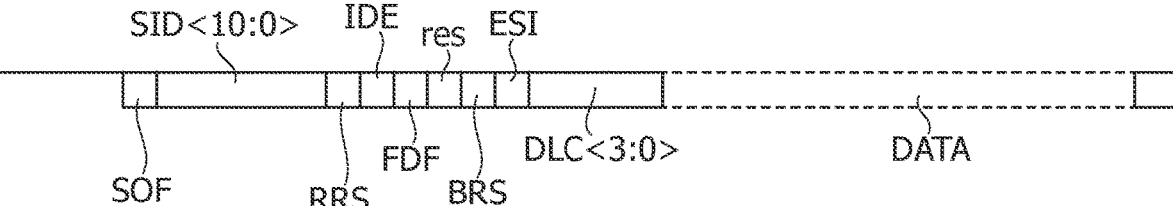
FIGS. 13A and 13B show an example of a CAN FD Light frame.
Figure 13B:
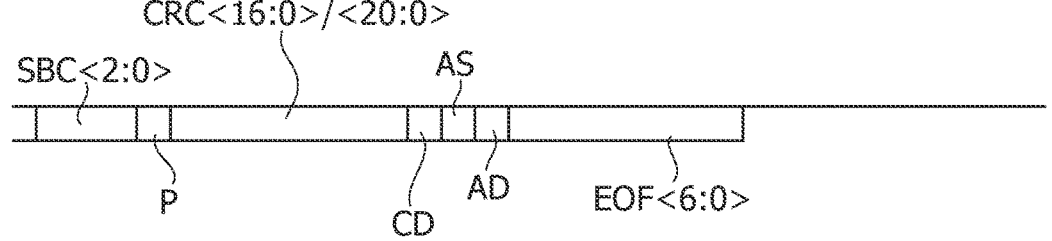

However, such a pull-up resistance R is required when sharing the transmission line/node TXL between a plurality of CAN, CAN FD or CAN XL controllers. Specifically, as shown in FIGS. 13A and 13B a typical CAN frame comprises in sequence:

a start-of-frame bit SOF set to the dominant level;
  an 11-bit CAN standard identifier SID<10:0>, often also identified as "Base Identifier" or "base ID" in ISO 11898-1;
  a Remote Request Substitution bit RRS;
  an Identifier Extension bit IDE;
  a Flexible Data Format bit FDS;
  a reserved bit res usually set to the dominant level;
  a Bit Rate Switch bit BRS;
  an Error Status Indicator bit ESI;
  a 4-bit Data Length Code field DLC <3:0>, which permits to specify the amount of data to be transmitted (values 0x0000 to 0x1000 correspond to 0-8 data bytes, and values 0x1001 to 0x1111 correspond to 12, 16, 20, 24, 32, 48 and 64 data bytes, respectively);
  the payload DATA, which may correspond to 0-8, 12, 16, 20, 24, 32, 48 and 64 data bytes (see the field DLC);

a 3-bit Stuff Bit Counter field SBC<2:0>;
  an even parity bit P;
  a Cyclic Redundancy Check field CRC having 17 bits (for up to 16 data bytes) or 21 bits (for 20 to 64 data bytes);
  a CRC Delimiter bit CD usually set to the recessive level;
  an Acknowledge bit AS;
  an Acknowledge Delimiter bit AD usually set to the recessive level; and
  a 7-bit End-of-Frame field EOF<6:0> set to the recessive level.

When a sender wants to send a CAN, CAN FD or CAN XL frame, it sends a dominant bit to the bus 20, i.e., the start-of-frame (SOF) bit, e.g., by setting the respective signal TXD to low. Accordingly, when at least one sender sends a dominant bit all nodes detect the dominant state of the bus, either via the CAN bus or via the shared reception line/node RXL.

In this respect, CAN, CAN FD and CAN XL determine the right to access the CAN bus 20 by arbitration. Specifically, the CAN controllers send the bit stream of their frame identifier SID via the signal TXD and monitor the value of the signal RXD. If a logic '1' ("recessive") is transmitted via the signal TXD, but a logic '0' ("dominant") is received via the signal RXD, the sender stops sending its data and becomes a receiver/slave node, because an identifier SID with a higher bus access priority tries to access the bus.

Moreover, after the successful reception of a CAN, CAN FD or CAN XL frame each receiving node sends a dominant bit in the acknowledge slot (acknowledge bit AS). This means that if at least one receiver has received the frame successfully the sender detects a dominant bit. This way the sender knows that at least one other node has received the frame.

Accordingly, when sharing the transmission line/node TXL for a plurality of CAN, CAN FD or CAN XL controllers, due to the arbitration and the ACK-bit, the high level can only be defined passively via the pull-up resistance R to avoid potential damaging bus contention.

However, the inventors have observed that CAN FD Light works slightly different. In fact, CAN FD Light is a commander/responder protocol, wherein only one controller 500 starts the transmission of data at a given time. Therefore, only one controller 500 sends the SOF-bit, and the arbitration phase may be omitted. In this respect, in the CAN FD Light protocol, also the acknowledge in the acknowledge slot may be omitted, because the sender may always recognize if a frame has not been transferred successfully due to the commander/responder structure. Accordingly, a CAN FD Light responder may not acknowledge the reception, i.e., may not set the ACK-bit to the dominant level, and a recessive ACK-bit may be considered by the CAN FD Light commander as a successful transmission. The transmission failure may then be detected by the missing response from the addressed responder.

However, in principle, the CAN FD Light protocol may also be used to exchange data with CAN or CAN FD controllers implementing just receiver/slave circuits. However, such controllers are usually configured to respond with a dominant level in the acknowledge slot. Similarly, also a CAN FD Light controller, even though not being mandatory, may be configured to respond with the dominant level in the acknowledge slot in order to be compatible with CAN and CAN FD controllers. Accordingly, in principle, during the acknowledge slot one or more controllers receiving the data may send a dominant level, while the transmitting CAN FD Light controller 500 (and possible other CAN FD Light controllers) send a recessive level.

However, in this respect, the inventors have observed that the rising slope between the CRC-delimiter and the ACK-slot is less critical, because CAN FD Light does not need the recessive ACK-signaling due to the commander/responder structure. The sender may always recognize if a frame has not been transferred successfully. Similarly, also the rise time between the ACK-bit and the ACK-delimiter is also not critical due to the allowed ACK-bit extension into the ACK-delimiter bit. According to the CAN/CAN FD standard a dominant value in this bit should be ignored.

Accordingly, the inventors have observed that due to the fact that only one CAN FD Light controller 500 will transmit data on the CAN bus and/or on the transmission line TXL (except for the ACK-signal) the recessive level can be actively driven, i.e., the CAN FD Light controller 500 may set the voltage at the transmission terminal TX via the push-pull configuration. This reduces the time of the rising edge on the transmission line TXL, improves the robustness against distortion and increases the time during the reception of a bit in which the bit value is stable, thus adding margin to the point at which the bit value must be sampled by the receiver.

Accordingly, in a CAN FD Light system, the transmission line/node TXL may be shared by several CAN controllers (see FIGS. 6 and 8) using a push-pull output driver configuration for sending a bit, except for the acknowledge slot. In this slot a passive pull-up via a pull-up resistance R is preferable in order to support also CAN controllers responding with a dominant level in this slot. In fact, as mentioned before, CAN FD Light controllers may implement the ACK-bit for compatibility with existing CAN FD protocol controllers that are embedded in the commander. It can be optionally transmitted recessive in case future CAN FD protocol controllers may be configured to ignore this bit. Conversely, the CAN FD Light protocol does not require the ACK-bit. In any case, due to the fact that the CAN FD specification allows the extension of the acknowledge bit into the acknowledge delimiter slot, which gives two bit-times time, the ACK-bit is far less critical than the other bits.

In various embodiments, also the recessive bits of the end-of-frame (EOF) and/or the bus idle (recessive level) are sent passively using the pull-up resistance R. Therefore, in various embodiments, the active sending of the recessive bits (logic 1 bits) may end at the beginning, during or immediately after the CRC-delimiter bit CD.

Figure 14A:
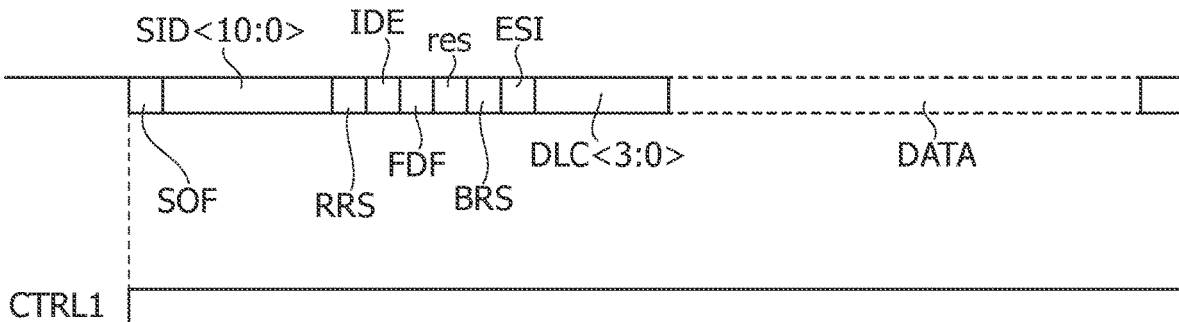
FIGS. 14A and 14B show an embodiment of a control signal used by the output driver circuits of FIGS. 11 and 12.
Figure 14B:
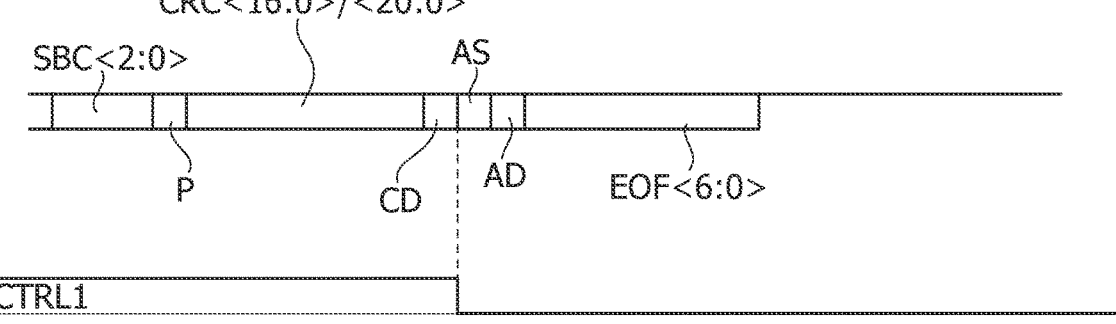

This is also shown in FIGS. 14A and 14B, where a CAN FD Light controller 500 transmits via the signal TXD again sequentially the bits of a CAN FD Light frame, in particular the start-of-frame bits SOF (having a dominant level), and the following bits including the Cyclic Redundancy Check field CRC. Specifically, in various embodiments, these bits are transmitted by using the push-pull configuration. For example, for this purpose, the CAN FD Light controller 500 may set the control signal CTRL1 to the logic level (e.g., high) in order to enable the push-pull configuration (see also the description of FIGS. 11 and 12).

Conversely, once the cyclic Redundancy Check field CRC has been transmitted, the CAN FD Light controller 500 puts the terminal TX in the high-impedance state. For example, when using the driver circuit 5060 shown in FIG. 12, it is sufficient that the CAN FD Light controller 500 changes the logic level of the control signal CTRL1 in order to maintain the switches SW1 and SW2 opened. Conversely, when using the driver circuit 5060 shown in FIG. 12, the CAN FD Light controller 500 has also to set the signal TXD to high. However, in case of a CAN FD Light frame, the bits CD, AS, AD, and EOF are already set to high.

As mentioned before, the exact position of the slopes of the control signal CTRL1 is not critical. For example, the CAN FD Light controller 500 may change the logic level of the control signal CTRL1, e.g., set the control signal CTRL1 to high, even before transmitting the start-of-frame SOF bit, e.g., one or more periods of a CAN FD Light bit, because the CAN FD Light controller 500 knows that it should transmit a frame and no other sender is expected to do so. Therefore, no other CAN FD Light controller 500 will send a frame during the interframe-space. This additional delay between the activation of the push-pull configuration and the end of the SOF bit increases at most the delay between a response requested by the commander and the respective response by the responder. Accordingly, in general, it is sufficient that the push-pull configuration is enabled at the end of the SOF bit.

As mentioned before, the last dominant to recessive edge that could be critical and should preferably be actively pulled to high is between the last bit of the CRC-field and the CRC-delimiter CD, which is always transmitted recessive. Accordingly, after this slope, the terminal TX may be set into the high-impedance state, e.g., by setting the signal CTRL1 to low. Accordingly, the terminal TX may be set into the high impedance state at any time between the start and the end of the CRC-delimiter CD, preferably after a given (e.g., constant) delay with respect to the instant when the CRC-delimiter CD starts.

Moreover, in a system comprising exclusively CAN FD Light controllers, the CAN FD Light responders are not expected to transmit a dominant ACK bit. Accordingly, in this case, the terminal TX may be set into the high impedance state also during the ACK-bit AS.

Accordingly, even in the tightest timing case the switching between the push-pull configuration and the high-impedance state may be accomplished at least with one bit time for the transition (with respect to the start of the SOF-bit and with respect to the end of the CRC-delimiter bit CD).

In the following will now be described a possible hardware implementation of the CAN FD Light controller 500. As described in the foregoing, a CAN FD Light commander controls the entire communication and initiates each communication cycle by either sending a frame without expecting an answer from the other network participants ("responders"), such as broadcast frames, or by sending a frame to a dedicated addressed responder while expecting an answer from this responder. i.e., unicast frames in a request and answer scheme. The request frames can also be used to send data to the addressed responder. Only the addressed responder from which an answer is requested is expected to send a frame back, i.e., no other device on the bus is expected to send data at the same time. Accordingly, the sequence of frames on the bus 20 is precisely defined and no arbitration is required. For example, with this scheme, error frames are not required, because the communication direction and the answers are clearly identified. Similarly, also an acknowledge neither from the commander nor from the responders is required. Erroneous frames may be dropped and are regarded in the CAN FD Light scheme as not having been received.

Accordingly, in a CAN FD Light system, a CAN FD Light controller 500 may prepare the complete frame prior to transmission and then send the bit-sequence of the frame without running an arbitration. For example, as described in the previously cited Italian Patent Applications 102021000022037 and 102021000022124, this implies that the CAN FD Light controller 500 may comprise a digital processing circuit 102, such as a sequential logic circuit implementing a finite state machine and/or a microprocessor, configured to prepare the complete CAN FD Light frame and a hardware serial communication interface 5000 configured to sequentially transmit the bits of the CAN FD Light frame.

Figures 15, 16:
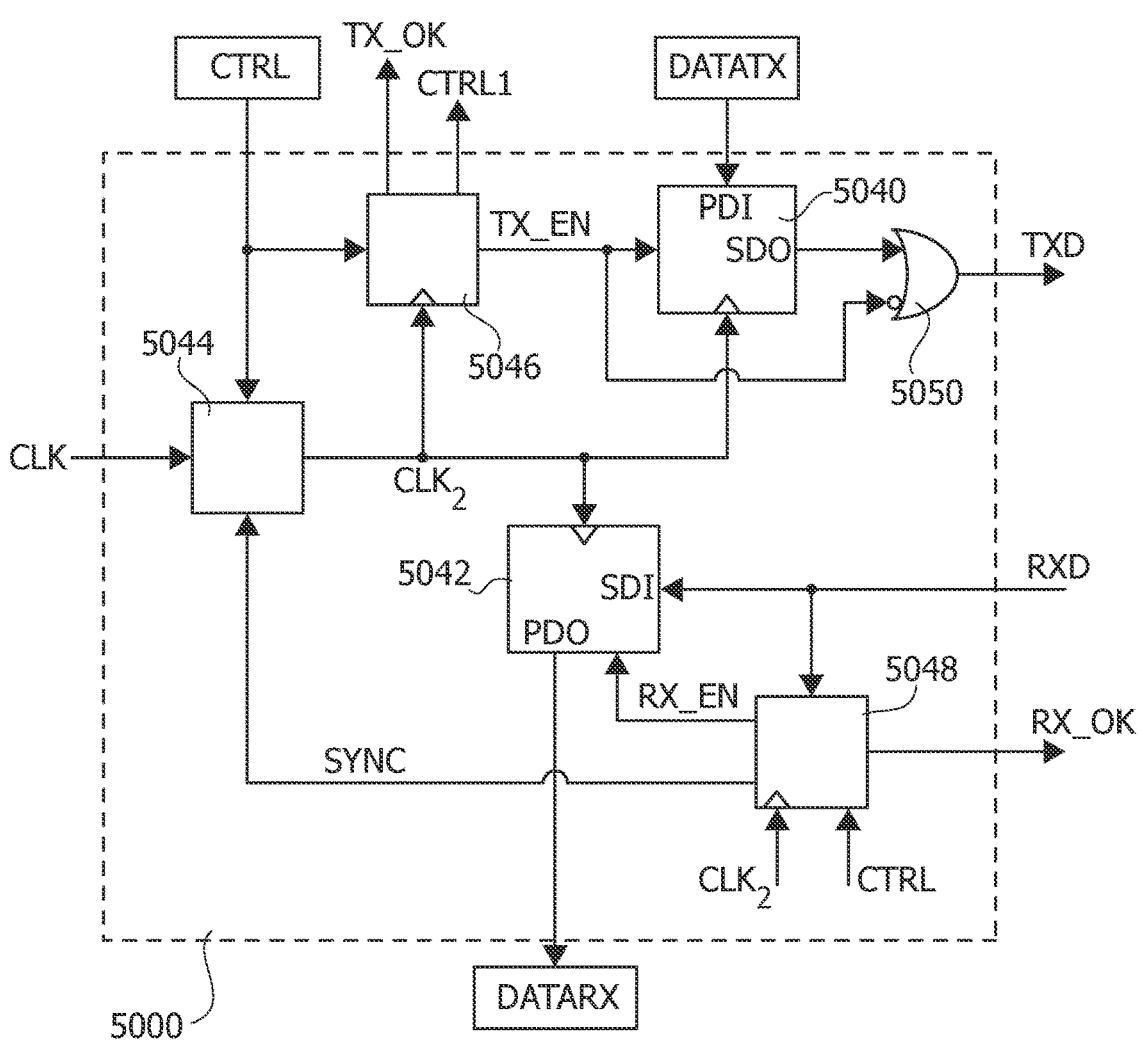
FIGS. 15 and 16 show an embodiment of a serial communication interface for a CAN FD Light controller according to FIGS. 6 to 10.

For example, FIG. 15 shows a possible embodiment of such a communication interface 5000 based on the disclosure of documents 102021000022037 and 102021000022124.

Specifically, in the embodiment considered, the hardware communication interface 5000 comprises two shift registers 5040 and 5042. Specifically, in the embodiment considered, the shift register 5040 is used to store the data to be transmitted. In general, the two shift registers 5040 and 5042 could also be implemented with the same shift register.

Accordingly, once the digital processing circuit 102 has generated the data of the transmission frame, the digital processing circuit 102 may also determine the number of bits to be transmitted. Specifically, in various embodiments, the digital processing circuit 102 is configured to write data to a control register CTRL of the communication interface 5000, which identify the number of bits to be transmitted.

Accordingly, once a data transmission is requested, the hardware communication interface 500 receives data DATATX to be transmitted (e.g., directly from the digital processing circuit 102 or by using a DMA data transfer). Specifically, the transmission data DATATX may correspond to the data of the complete frame or just a portion thereof. For example, in the embodiment considered, the transmission data DATATX are transferred to the shift register 5040, e.g., by using a parallel data input PDI of the shift register 5040. Generally, the transmission frame provided via the data DATATX may also not comprise the start-of-frame bit SOF. For example, in this case, a first bit of the shift-register 5040 may be set to "0", while the other bits of the shift-register 5040 are mapped to respective bits of the transmission data register DATATX.

In various embodiments, the shift register 5040 is configured to sequentially transmit the bits stored to the shift register 5040 as a function of a clock signal $CLK_2$ and a transmission enable signal TX_EN.

Specifically, in the embodiment considered, the hardware communication interface 5000 comprises also a clock management circuit 5044 configured to generate the clock signal $CLK_2$ for the hardware communication interface 5000 in response to a system clock signal CLK of the processing system 10a.

For example, as shown in FIG. 16, in various embodiments, the clock management circuit may comprise a clock pre-scaling circuit 5058 configured to generate a pre-scaled clock signal $CLK_{PRE}$ having a reduced frequency with respect to the frequency of the clock signal CLK, wherein the scaling factor may be programmable as a function of the configuration data stored to the control register(s) CTRL. For example, the pre-scaling circuit 5058 may be implemented with a counter configured to increase a count value in response to the clock signal CLK, wherein the counter changes the logic level of the clock signal $CLK_{PRE}$ when the count value reaches a threshold value, wherein the threshold value is determined as a function of the configuration data provided by the control register(s) CTRL.

In the embodiment considered, the pre-scaled clock signal $CLK_PR$ is then provided to a further down-scaling circuit 5060 configured to generate the clock signal $CLK_2$ having a reduce frequency with respect to the frequency of the clock signal $CLK_{PRE}$, wherein the scaling factor may be fixed or programmable as a function of the configuration data stored to the control register(s) CTRL. For example, the down-scaling circuit 5060 may be implemented with a counter configured to increase a count value in response to the clock signal $CLK_{PRE}$, wherein the counter changes the logic level of the clock signal $CLK_{PRE}$ when the count value reaches a threshold value, wherein the threshold value is optionally determined as a function of the configuration data provided by the configuration register(s) CTRL.

As shown in FIG. 15, in various embodiments, the operation of the down-scaling circuit 5060 is changed in response to a synchronization signal SYNC, which is however only used when receiving data and will be described later on.

Accordingly, when transmitting data, the clock signal $CLK_2$ corresponds to a down-scaled version of the clock signal CLK (as a function of the configuration data stored to the control register CTRL), and may have, e.g., 1 MHz or another frequency supported by CAN FD Light.

As mentioned before, the shift register 5040 also receives an enable signal TX_EN, which enables the data transmission operation. Specifically, in the embodiment considered, the shift register 5040 is configured to, when the enable signal TX_EN is asserted and in response to the clock signal $CLK_2$, sequentially provide at a serial data output SDO the content of the shift-register 5040. Accordingly, when the enable signal TX_EN is asserted, the shift register 5040 sequentially provides the bits of the data stored to the shift register 5040 (starting from the start-of-frame bit SOF).

In the embodiment considered, the enable signal TX_EN is generated by a transmission control circuit 5046 configured to determine whether a given number of requested bits has been transmitted. Accordingly, in various embodiments, the transmission control circuit 5046 is configured to determine the number of requests bits to be transmitted as a function of the configuration data stored to the control register(s) CTRL. For example, the configuration data stored to the control register(s) CTRL may correspond to the total number of bits to be transmitted (with or without the start-of-frame bit SOF).

For example, in various embodiments, the transmission control circuit 5046 may comprise a counter, which is increased in response to the clock signal $CLK_2$, thereby indicating the number of transmitted bits. Accordingly, the counter may be reset when starting a new data transmission operation, thereby asserting the enable signal TX_EN, and the transmission control circuit 5046 de-asserts the enable signal TX_EN when the requested number of bits has been transmitted. For example, in this case, transmission control circuit may assert the control signal TX_OK when the transmission control circuit 5046 de-asserts the enable signal TX_EN.

In various embodiments, the hardware communication interface 5000 comprises a combinational logic circuit 5050 configured to set the signal TXD to the recessive level, e.g., high, when the enable signal TX_EN is de-asserted. For example, in case the enable signal TX_EN is set to low when the enable signal TX_EN is de-asserted, the combinational logic circuit 5050 may be implemented with a logic OR gate receiving at input the serial data output signal SDO of the shift register 5056 and the inverted version of the enable signal TX_EN, and providing at output the signal TXD. The combinational logic circuit 5050 is purely optional, because the serial data output signal SDO may also be set to the recessive level, when the enable signal TX_EN is de-asserted, e.g., because the end-of-frame bits EOF are already set to the recessive level.

Accordingly, in various embodiments, the transmission control circuit 5046 may also generate the control signal CTRL1 used to selectively enable the push-pull configuration or the high-impedance state. For example, in line with the previous description, the transmission control circuit 5046 may change the logic level of the signal CTRL1 together with (or before) the start-of-frame bit SOF, and may change again the logic level of the signal CTRL1 with the CRC delimiter CD. However, knowing the length of the CAN FD Light frame to be transmitted, the transmission control circuit 5046 may determine the position of the CRC delimiter CD, e.g., by subtracting nine from the total length of the CAN FD Light frame. Alternatively, the data provided by the processing circuit 102 may also just indicate the length until the CRC delimiter CD (with or without the delimiter CD), and the transmission control circuit 5046 may transmit automatically further 9 (if the bit CD is already included) or 10 (if the bit CD has to be added) recessive bits, e.g., by setting the signal TX_EN (and the signal CTRL1) to low and asserting the signal TX_OK only after 9 or 10 further cycles of the signal CLK₂. Generally, the transmission control circuit 5046 may assert the signal TX_OK at any time once the CRC bits have been transmitted, because it is sufficient that the signal TXD is set to high (e.g., via the signal provided by the shift register 5040 and/or by setting the signal TX_EN to low) and the control signal CTRL1 is de-asserted, whereby all following bits are implicitly set to the recessive level.

Conversely, the shift register 5042 is configured to store the bits received via the signal RXD. Specifically, when no data transmission occurs, the reception signal RXD has the recessive level, e.g., high. Once a transmission is started by another device, the start-of-frame bits SOF is transmitted, whereby the reception signal RXD has the dominant level, e.g., low. Accordingly, in various embodiments, the hardware communication interface 5000 comprises a reception control circuit 5048. Specifically, the reception control circuit 5048 is configured to assert a reception enable signal RX_EN in response to a change of the signal RXD from the recessive level to the dominant level, e.g., in response to a falling edge of the signal RXD.

Generally, as mentioned before, the start-of-frame bit SOF may be followed by a variable number of bits (usually up to 675 bits). However, the end-of-frame condition is precisely determined by a sequence of 7 bits (end-of-frame field EOF) or even 8 bits (when considering also the bit AD) being set to the recessive level. In fact, the bit stuffing of the CAN FD Light protocol guarantees a change of the logic level of the other data at most after a sequence of five bits having the same logic level.

Accordingly, in various embodiments, the reception control circuit 5048 is configured to de-assert a reception enable signal RX_EN in response to determining that seven or eight consecutive bits are set to the recessive level. For example, for this purpose, the reception control circuit 5048 may comprise a counter configured to increase a count value in response to the clock signal CLK₂, wherein the counter is reset when the signal RXD is set to the dominant level. Accordingly, in this case, the reception control circuit 5048 may de-assert the reception enable signal RX_EN when the counter reaches 7 or 8.

Generally, in addition or as alternative to monitoring the EOF bits, the reception control circuit 5048 may also directly process the received data, in particular the field DLC, in order to determine an expected number of transmitted bits. Accordingly, in this case, the reception of data may be stopped once the expected number of bits has been received. Accordingly, the expected number of bits may include just the bits until the last CRC bits, or possibly also one or more of the following bits CD, AS, AD and EOF.

Accordingly, in various embodiments, the shift register 5042 is configured to, when the enable signal RX_EN is asserted and in response to the clock signal CLK₂, sequentially add to the data stored to the shift register 5042 the logic level applied to a serial data input SDI of the shift register 5042, wherein the serial data input SDI is connected to the reception signal RXD. Generally, the reception control circuit 5048 may assert the reception enable signal RX_EN with the start-of-frame bit SOF or only for the next bit, whereby the start-of-frame bit SOF is stored or not stored to the shift register 5042.

Accordingly, once seven or eight consecutive recessive bits have been received and/or once having received the expected number of bits, the reception control circuit 5048 de-asserts the reception enable signal RX_EN. The reception control circuit 5048 may also assert the control signal RX_OK in this case. Moreover, once the seven or eight consecutive recessive bits have been received and/or once having received the expected number of bits, e.g., in response to the signal RX_OK, the hardware communication interface 5000 transfers the content of the shift register 5042, e.g., by providing the received data DATARX, e.g., by using a parallel data output PDO of the shift register 5042. Generally, the received data DATARX may also provide sequentially during the data reception portions of the received CAN FD Light frame.

Accordingly, in the embodiments considered, the transmission of data occurs in response to the clock signal CLK₂, and the data are shifted out synchronously with this clock CLK₂. Conversely, the data received via the reception signal RXD may have a phase and/or a frequency deviation from this clock CLK₂. Substantially, a frequency deviation leads to accumulated phase shifts, i.e., a frequency deviation can be viewed as a sequence of phase shifts. In various embodiments, to compensate phase shifts the reception control circuit 5048 may be configured to adjust the sampling point of the received data based on detected bit transitions. Specifically, in various embodiments, is used for this purpose the synchronization signal SYNC. Specifically, in various embodiments, the reception control circuit 5048 is configured to assert the synchronization signal SYNC in response to detecting a change of the logic level of the reception signal RXD, i.e., from the recessive level to the dominant level, e.g., in response to a falling edge, and/or from the dominant level to the recessive level, e.g., in response to a rising edge. For example, for this purpose, the reception control circuit 5048 may sample the reception signal RXD in response to the clock signal CLK_{PRE} and assert the synchronization signal SYNC when a current sample is set to the dominant level and the previous sample is set to the recessive level and/or when a current sample is set to the recessive level and the previous sample is set to the dominant level.

As mentioned with respect to FIG. 16, the down-scaling circuit 5060 may be synchronized with the synchronization signal SYNC in order to generate the edge used to sample the reception signal RXD. For example, in various embodiments, the down-scaling circuit 5060 is implemented with a counter configured to increase a count value CNT, and reset the count value CNT when a maximum count value is reached. Moreover, in order to synchronize the count value CNT with the synchronization signal SYNC, the counter CNT may be reset in response to determining that the synchronization signal SYNC is asserted.

Accordingly, in various embodiment, the three-state configuration of the transmission terminal TX may also be controlled directly by the transmission control circuit 5046 of the hardware serial communication interface 5000.

In various embodiments, the generation of the signal CTRL1 may be enabled selectively via one or more respective bits in the control register CTRL, which permit to specify e.g., whether to:

enable the push-pull configuration only for the bits between the start-of-frame bis SOF and the CRC delimiter CD;

always use the push-pull configuration, e.g., in case an individual transceiver 320 is used and an external pull-up resistance R is omitted;

optionally always use the open drain driver configuration.

In this respect, the embodiment shown in FIG. 11 may be preferable, in particular when setting the terminal TX to ground GND for responding with an acknowledge in the acknowledge slot AS, because in this case, it is sufficient to just set the signal TXD to low, without changing the logic level of the signal CTRL1.

In various embodiments, the control register CTRL may also be used to generate the signal CTRL2 used to enable an optional internal pull-up resistor 5066.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A processing system comprising:
a positive supply terminal and a negative supply terminal; and
a sub-circuit comprising:
a transmission terminal;
a three-state driver circuit comprising:
a first electronic switch connected between the transmission terminal and the positive supply terminal; and
a second electronic switch connected between the transmission terminal and the negative supply terminal,
wherein the three-state driver circuit comprises a combinational logic circuit configured to monitor logic levels of a first signal and a second signal, and selectively activate one of the following switching states as a function of the logic levels of the first signal and the second signal:
in a first switching state, connect the transmission terminal to the positive supply terminal by closing the first electronic switch,
in a second switching state, connect the transmission terminal to the negative supply terminal by closing the second electronic switch, and
in a third switching state, put the transmission terminal in a high-impedance state by opening the first electronic switch and the second electronic switch; and
a CAN FD light controller configured to sequentially transmit bits of a CAN FD light frame, wherein the CAN FD light frame comprises:
a start-of-frame bit,
a sequence of bits comprising in sequence a Cyclic Redundancy Check (CRC), delimiter bit, an acknowledge bit, an acknowledge delimiter bit and an End-of-Frame field having 7 bits, and a plurality of intermediate bits between the start-of-frame bit and the CRC delimiter bit, and
wherein the CAN FD light controller is configured to sequentially transmit, in a first operating mode, the bits of the CAN FD light frame by generating the first signal and the second signal in response to a transmission clock signal in order to:
transmit the start-of-frame bit by activating the second switching state for one clock cycle,
sequentially transmit the intermediate bits by sequentially selecting a bit of the intermediate bits and activating the first or second switching states as a function of the logic level of the selected bit, and
once having transmitted the intermediate bits, activate the third switching state.

2. The processing system according to claim 1, wherein the CAN FD light controller is configured to transmit the sequence of bits by activating the third switching state for 10 clock cycles.

3. The processing system according to claim 1, wherein the combinational logic circuit of the three-state driver circuit is configured to:
in response to determining that the first signal is de-asserted, activate the second switching state,
in response to determining that the first signal is asserted and the second signal is asserted, activate the first switching state, and
in response to determining that the first signal is asserted and the second signal is de-asserted, activate the third switching state.

4. The processing system according to claim 3, wherein the CAN FD light controller is configured to:
generate a transmission signal by sequentially providing the bits of the CAN FD light frame in response to the transmission clock signal as the first signal;
assert the second signal when providing the start-of-frame bit and the intermediate bits; and
de-assert the second signal when providing the sequence of bits.

5. The processing system according to claim 4, wherein the CAN FD light controller comprises:
a digital processing circuit configured to generate a frame comprising at least the intermediate bits of the CAN FD light frame;
a serial communication interface comprising a control register configured to store data identifying a requested number of bits;
a clock management circuit configured to receive a system clock signal and generate a down-scaled clock signal, wherein the transmission clock signal corresponds to the down-scaled clock signal;
a transmission shift register configured to generate the transmission signal, when a transmission enable signal is asserted, by sequentially providing a content of the transmission shift register in response to the transmission clock signal, wherein the processing system is configured to selectively transfer the frame from the digital processing circuit to the transmission shift register; and
a transmission control circuit configured to:
receive a start of transmission signal requesting transmission of data,
in response to the start of transmission signal, assert the transmission enable signal,
when the transmission enable signal is asserted, increase a transmission count value in response to the transmission clock signal, determine whether the transmission count value reaches the requested number of bits, and in response to determining that the transmission count value reaches the requested number of bits, de-assert the transmission enable signal.

6. The processing system according to claim 5, wherein the transmission control circuit is configured to:

in response to the start of transmission signal, assert the second signal, determine whether the serial communication interface provides the last bit of the intermediate bits, and in response to determining that the transmission shift register provides the last bit of the intermediate bits, de-assert the second signal.

7. The processing system according to claim 1, wherein the combinational logic circuit of the three-state driver circuit is configured to:

in response to determining that the first signal is de-asserted and the second signal is asserted, activate the second switching state, in response to determining that the first signal is asserted and the second signal is asserted, activate the first switching state, and in response to determining that the second signal is de-asserted, activate the third switching state.

8. The processing system according to claim 1, further comprising:

a CAN FD transceiver comprising a transmission terminal and a reception terminal, wherein the transmission terminal of the CAN FD transceiver is connected to the transmission terminal of the sub-circuit and the reception terminal of the CAN FD transceiver is connected to the reception terminal of the sub-circuit, and wherein, in a second operating mode, the CAN FD light controller is configured to sequentially transmit the bits of the CAN FD light frame by generating the first signal and the second signal in response to a transmission clock signal in order to:

transmit the start-of-frame bit by activating the second switching state for one clock cycle, sequentially transmit the intermediate bits by sequentially selecting a bit of the intermediate bits and activating the first or the second switching state as a function of the logic level of the selected bit, and once having transmitted the intermediate bits, activate the first switching state.

9. An integrated circuit comprising:

the processing system according to claim 1.

10. A method for operating the processing system according to claim 1, the method comprising:

sequentially transmitting the bits of the CAN FD light frame.

11. A processing system comprising:

a positive supply terminal and a negative supply terminal; and a sub-circuit comprising:

a transmission terminal;

a three-state driver circuit comprising:

a first electronic switch connected between the transmission terminal and the positive supply terminal; and a second electronic switch connected between the transmission terminal and the negative supply terminal, wherein the three-state driver circuit comprises a combinational logic circuit configured to monitor logic levels of a first signal and a second signal, and selectively activate one of the following switching states as a function of the logic levels of the first signal and the second signal:

in a first switching state, connect the transmission terminal to the positive supply terminal by closing the first electronic switch, in a second switching state, connect the transmission terminal to the negative supply terminal by closing the second electronic switch, and in a third switching state, put the transmission terminal in a high-impedance state by opening the first electronic switch and the second electronic switch;

a CAN FD light controller configured to sequentially transmit bits of a CAN FD light frame, wherein the CAN FD light frame comprises:

a start-of-frame bit, a sequence of bits comprising in sequence a Cyclic Redundancy Check (CRC), delimiter bit, an acknowledge bit, an acknowledge delimiter bit and an End-of-Frame field having 7 bits, and a plurality of intermediate bits between the start-of-frame bit and the CRC delimiter bit, and wherein the CAN FD light controller is configured to sequentially transmit, in a first operating mode, the bits of the CAN FD light frame by generating the first signal and the second signal in response to a transmission clock signal in order to:

transmit the start-of-frame bit by activating the second switching state for one clock cycle, sequentially transmit the intermediate bits by sequentially selecting a bit of the intermediate bits and activating the first or second switching states as a function of the logic level of the selected bit, and once having transmitted the intermediate bits, activate the third switching state; and a reception terminal, wherein the CAN FD light controller is configured to sequentially receive the bits of a further CAN FD light frame via the reception terminal.

12. The processing system according to claim 11, further comprising a CAN FD transceiver comprising a transmission terminal and a reception terminal, wherein the transmission terminal of the CAN FD transceiver is connected to the transmission terminal of the sub-circuit, and wherein the reception terminal of the CAN FD transceiver is connected to the reception terminal of the sub-circuit.

13. The processing system according to claim 11, further comprising a further sub-circuit including a further transmission terminal, a further reception terminal, a further three-state driver circuit and a further CAN FD light controller, wherein the further transmission terminal of the further sub-circuit is connected to the transmission terminal of the sub-circuit, wherein the reception terminal of the further sub-circuit is connected to the transmission terminal of the further sub-circuit, and wherein the reception terminal of the sub-circuit is connected to the transmission terminal of the sub-circuit.

14. The processing system according to claim 12, further comprising a further sub-circuit including a further transmission terminal, a further reception terminal, a further three-state driver circuit and a further CAN FD light controller, wherein the further transmission terminal of the further sub-circuit is connected to the transmission terminal of the sub-circuit and the reception terminal of the further sub-circuit is connected to the reception terminal of the sub-circuit.

15. The processing system according to claim 14, further comprising a pull-up resistance connected between the transmission terminal of the sub-circuit and the positive supply terminal.

16. A vehicle comprising:

a plurality of processing systems, each processing system according to claim 10, wherein the CAN FD transceivers of the processing systems are connected to a CAN bus.

17. The processing system according to claim 16, further comprising a pull-up resistance connected between the transmission terminal of the sub-circuit and the positive supply terminal.

18. A method for operating a processing system comprising:

sequentially transmitting bits of a CAN FD light frame in a commander/responder communication protocol, the commander/responder communication protocol comprising a CAN FD Light protocol, wherein the CAN FD light frame comprises:

a start-of-frame bit, a sequence of bits comprising in sequence a Cyclic Redundancy Check (CRC) delimiter bit, an acknowledge bit, an acknowledge delimiter bit and an End-of-Frame field having 7 bits, and a plurality of intermediate bits between the start-of-frame bit and the CRC delimiter bit, wherein transmitting the bits of the CAN FD light frame comprises generating a first signal and a second signal of the processing system in response to a transmission clock signal in order to:

transmit the start-of-frame bit by activating a second switching state for one clock cycle, sequentially transmit the intermediate bits by sequentially selecting a bit of the intermediate bits and activating a first switching state or the second switching state as a function of a logic level of a selected bit, and once having transmitted the intermediate bits, activate a third switching state, wherein generating the first signal and the second signal comprises:

controlling a three-state driver circuit comprising:

a first electronic switch connected between a transmission terminal and a positive supply terminal, a second electronic switch connected between the transmission terminal and a negative supply terminal, and a combinational logic circuit configured to monitor logic levels of the first signal and the second signal and selectively activate the first switching state by closing the first electronic switch, the second switching state by closing the second electronic switch, and the third switching state by opening both the first electronic switch and the second electronic switch.

19. The method of claim 18, wherein:

activating the first switching state and the second switching state comprises using a push-pull configuration to actively drive the transmission terminal, and activating the third switching state comprises placing the transmission terminal in a high-impedance state to enable passive transmission of the acknowledge bit, the acknowledge delimiter bit, and the End-of-Frame field.

20. The method of claim 18, wherein the sequence of bits is transmitted by activating the third switching state for 10 clock cycles.

* * * * *